United States Patent
Allen et al.

(10) Patent No.: US 6,566,251 B2
(45) Date of Patent: May 20, 2003

(54) METHOD FOR SELECTIVE DEPOSITION OF MATERIALS IN MICROMACHINED MOLDS

(75) Inventors: Mark G. Allen, Atlanta, GA (US); Florent Cros, Decatur, GA (US); Jin-Woo Park, Atlanta, GA (US); Kim Kieun, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 09/871,200

(22) Filed: May 31, 2001

(65) Prior Publication Data

US 2002/0142587 A1 Oct. 3, 2002

Related U.S. Application Data

(60) Provisional application No. 60/279,977, filed on Mar. 29, 2001.

(51) Int. Cl.[7] .......................................... H01L 21/4763
(52) U.S. Cl. ..................................... 438/639; 524/442
(58) Field of Search ................................ 438/424, 455, 438/412, 639, 745, 405, 39, 734; 524/442

(56) References Cited

U.S. PATENT DOCUMENTS

| | | | |
|---|---|---|---|
| 3,936,329 A | 2/1976 | Kendall et al. | 148/187 |
| 5,219,787 A | 6/1993 | Carey et al. | 437/187 |
| 5,426,070 A * | 6/1995 | Shaw et al. | 216/2 |
| 5,645,684 A | 7/1997 | Keller | 156/643.1 |
| 5,660,680 A | 8/1997 | Keller | 438/50 |
| 5,795,823 A | 8/1998 | Avanzino et al. | 438/639 |
| 6,015,599 A | 1/2000 | Keller et al. | 428/34.4 |
| 6,245,849 B1 * | 6/2001 | Morales et al. | 524/442 |

OTHER PUBLICATIONS

Park, et al., "Fully Integrated Passives Modules for Filter Applications Using Low Temperature Processes", pp. 592–597.

Liakopoulos, et al., "Ultrahigh Resolution DC Magnetic Field Measurements Using Microfabricated Fluxgate Sensor Chips", pp. 630–631.

Taylor, et al., "Fully Integrated Magnetically Actuated Micromachined Relays", Jun. 1998, vol. 7, pp. 181–191.

Epstein, et al., "Power MEMS and Microengines", Jun. 1997, pp. 753–756.

Romankiw, et al., "Evolution of the Plating Through Lithographic Mask Technology", pp. 253–263.

Cros, et al., "A Single–Mask Process for Micromachined Magnetic Devices", Jun. 4–8, 2000, pp. 138–141.

Conedera, et al., "Potentialities of a New Positive Photoresist for the Realization of Thick Moulds", pp. 173–175.

Lorenz, et al., "High–Aspect–Ratio, Ultrathick, Negative–Tone Near–UV Photoresist and its Applications for MEMS", pp. 33–39.

(List continued on next page.)

Primary Examiner—David Nelms
Assistant Examiner—David Vu
(74) Attorney, Agent, or Firm—Thomas, Kayden, Horstemeyer & Risley, LLP

(57) ABSTRACT

Methods for creating one or more structures in a micromachined device. In one arrangement, the methods include the steps of providing a substrate, forming upstanding nonconductive mold walls on the substrate so that first and second wells are formed, the second well being wider than the first well. The method further includes applying a first material to the surface of the wells so that the first well fills with the first material before the second well, and removing the first material from the second well while leaving a portion in the first well.

59 Claims, 30 Drawing Sheets

OTHER PUBLICATIONS

Chang, et al., "UV–LIGA Process for High Aspect Ratio Structures using Stress Barrier and C–shaped Etch Holes", pp. 1428–1431.

Lorenz, et al. "SU–8: A Low–Cost Negative Resist for MEMS", pp. 121–124.

Despont, et al., "High–Aspect–Ratio, Ultrathick, Negative–Tone Near–UV Photoresist for MEMS Applications", pp. 518–522.

Cros, et al., "A Single–Mask Process for Micromachined Magnetic Devices".

* cited by examiner

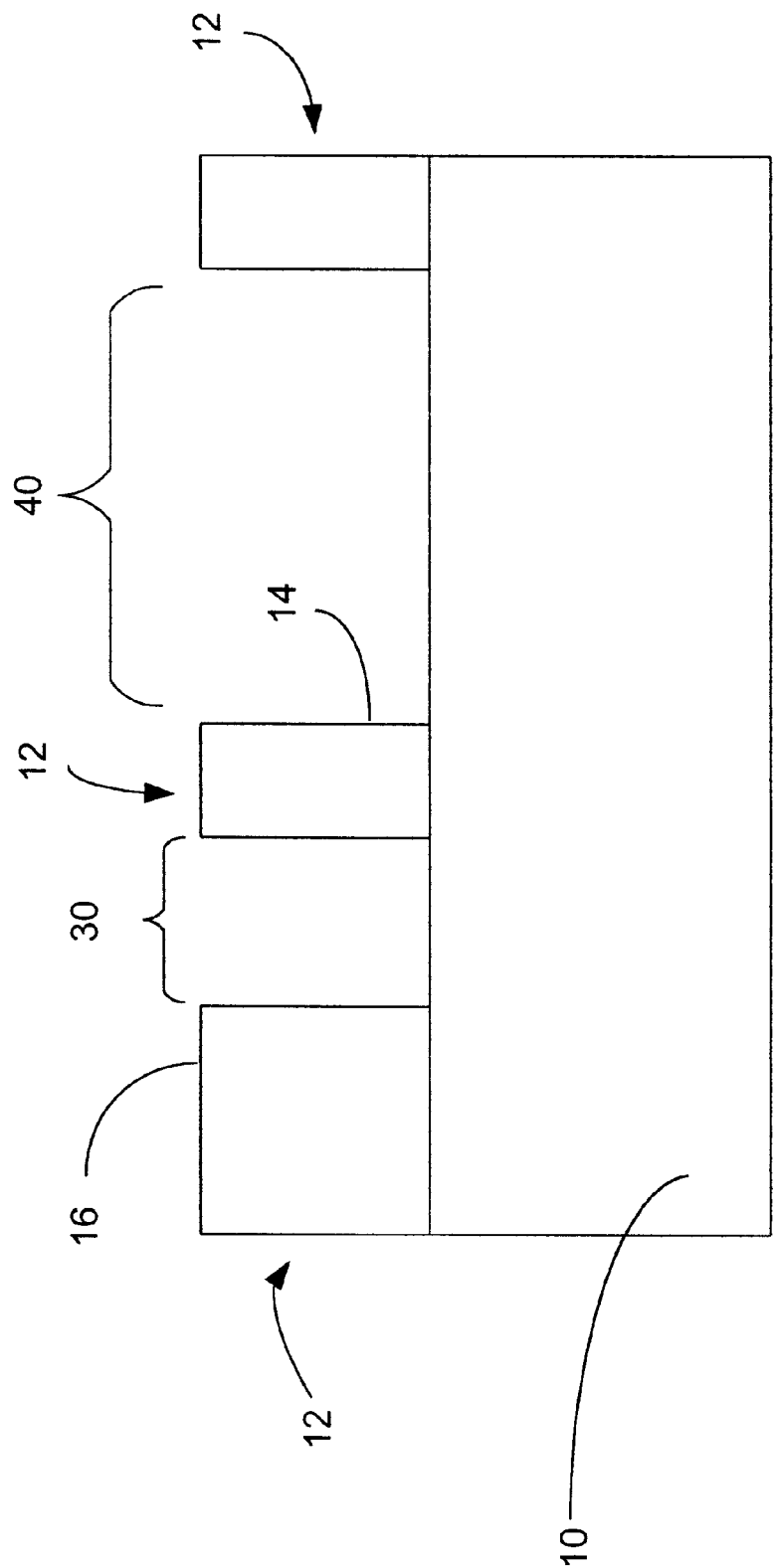

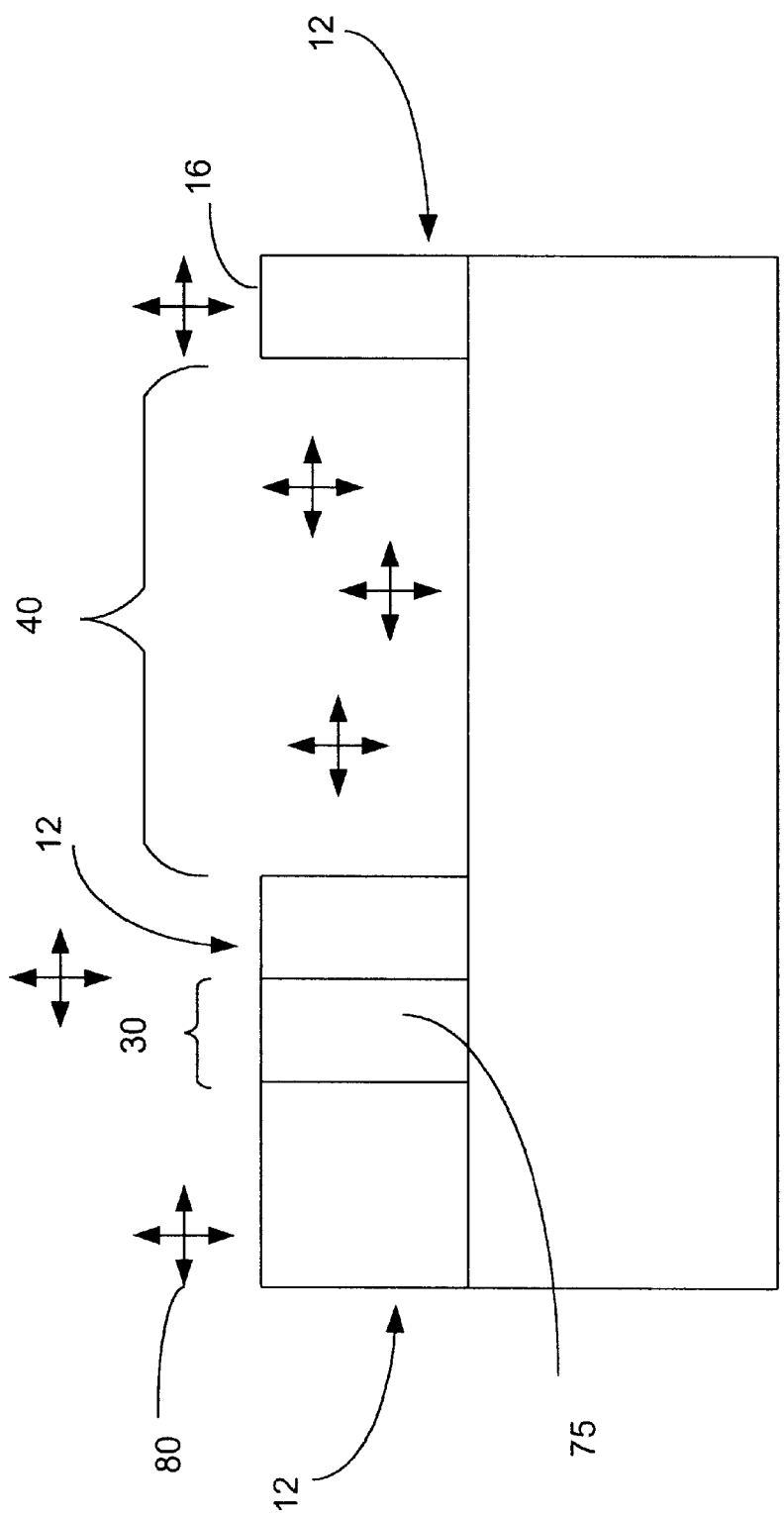

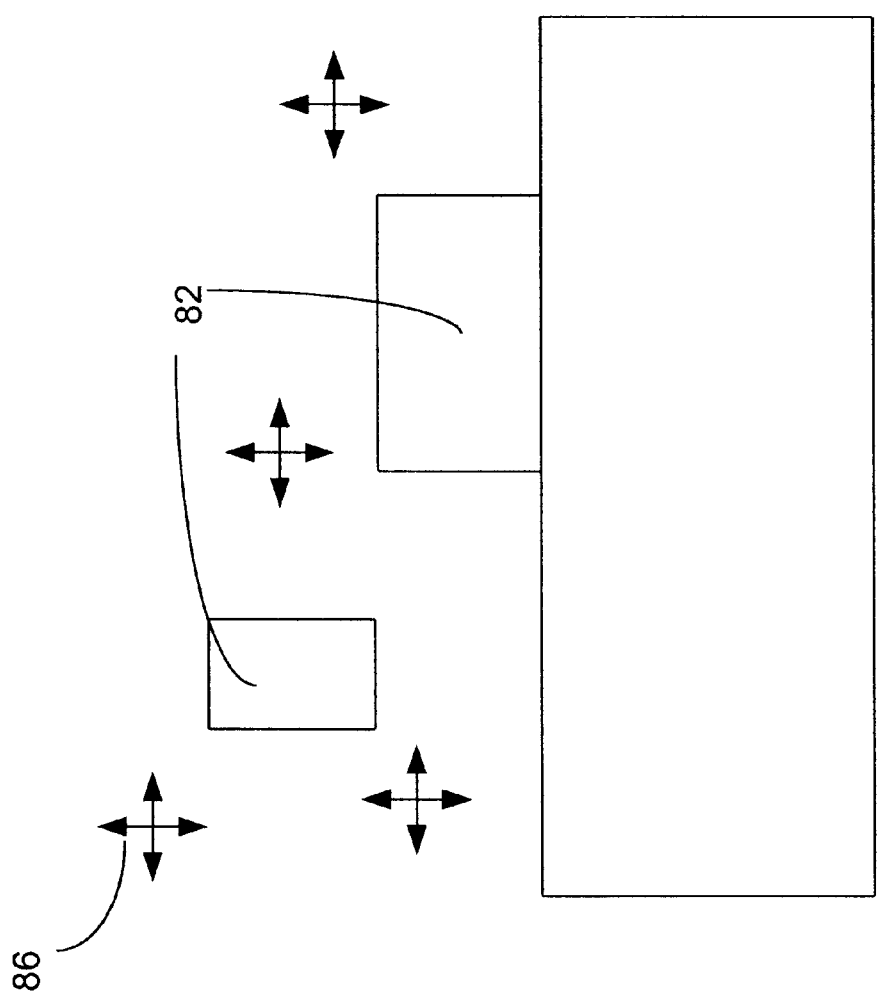

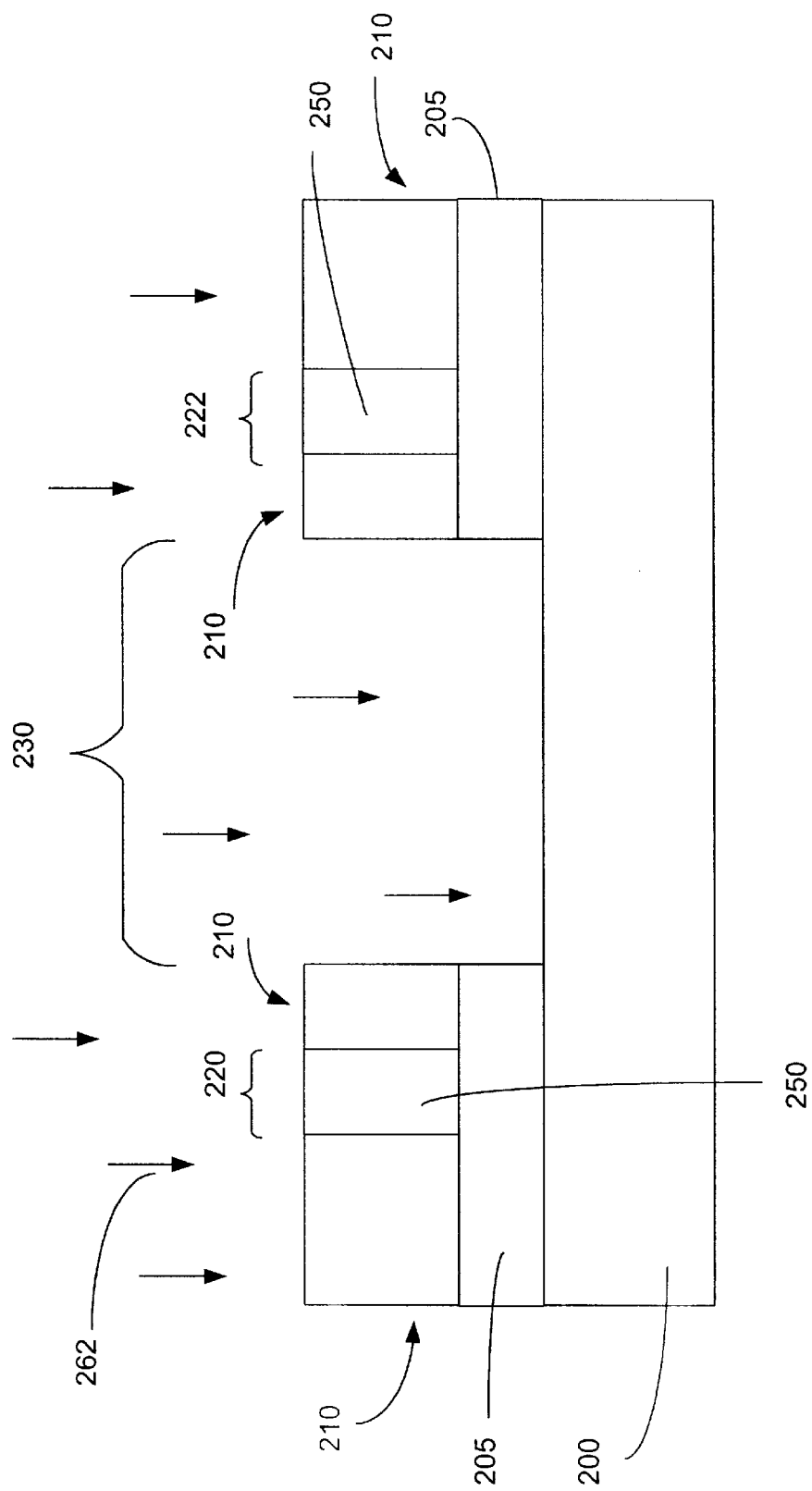

US 6,566,251 B2

METHOD FOR SELECTIVE DEPOSITION OF MATERIALS IN MICROMACHINED MOLDS

CROSS-REFERENCE TO RELATED APPLICATION

This application claims priority to copending U.S. Provisional Application Serial No. 60/279,977 entitled, "Method For Selective Deposition of Materials In Micromachined Molds," filed Mar. 29, 2001, which is hereby incorporated by reference in its entirety.

TECHNICAL FIELD

The present invention is generally related to micromachined devices and, more particularly, is related to a method for fabricating micromachined devices.

BACKGROUND OF THE INVENTION

The fabrication of microelectromechanical systems (MEMS) often involves a complex sequence of deposition and removal of materials in order to build up the desired microstructure. These complex fabrication sequences are usually necessary to fabricate magnetic MEMS devices and structures. For example, micromachined magnetic components, sensors, and actuators have applications in many areas, including integrated passive components, magnetic field sensing, large-stroke actuation, and electrical power generation on the microscale. Thus, facilitating the fabrication of micromachined magnetic components is of significant commercial importance.

Thus, a heretofore unaddressed need exists in the industry to address the complexity of the fabrication of MEMS.

SUMMARY OF THE INVENTION

The present invention provides, among other things, a method for creating one or more structures in a micromachined device. This method can be broadly summarized by the following steps: providing a substrate and forming upstanding mold walls on the substrate so that first and second wells are formed, the second well being wider than the first well; applying a first material to the surface of the wells so that the first well fills with the first material before the second well; and removing the first material from the second well while leaving a portion of the first material in the first well.

The present invention further provides for a method for selective deposition of materials in micromachined molds. This method can be broadly summarized by the following steps: creating a mold with wells of varying height-to-width ratios; applying a first fill layer material on the mold surfaces, such that the wells with the higher height-to-width ratios are filled before the wells with lower height-to-width ratios; and removing the first fill layer material until the wells with the lower height-to-width ratios have the first fill layer material removed, whereby a portion of the first fill layer material remains in the wells with the higher height-to-width ratios.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 1A is a cross sectional side view of an example step in a first selective deposition method of forming a mold layer with high and low aspect ratio wells on top of a substrate.

FIG. 1D is a cross sectional side of an example step in the first selective deposition method of etching back the material applied on the mold layer surfaces as depicted in FIG. 1B.

FIG. 6E is a cross sectional side view of an example step in the sixth selective deposition method of removing the sacrificial material layer depicted in FIG. 6B.

FIG. 8F is a cross sectional side view of an example step in the eighth selective deposition method of etching back the electrical insulating layer depicted in FIG. 8A.

DETAILED DESCRIPTION OF THE PREFERRED EMBODIMENTS

Figure 1B:
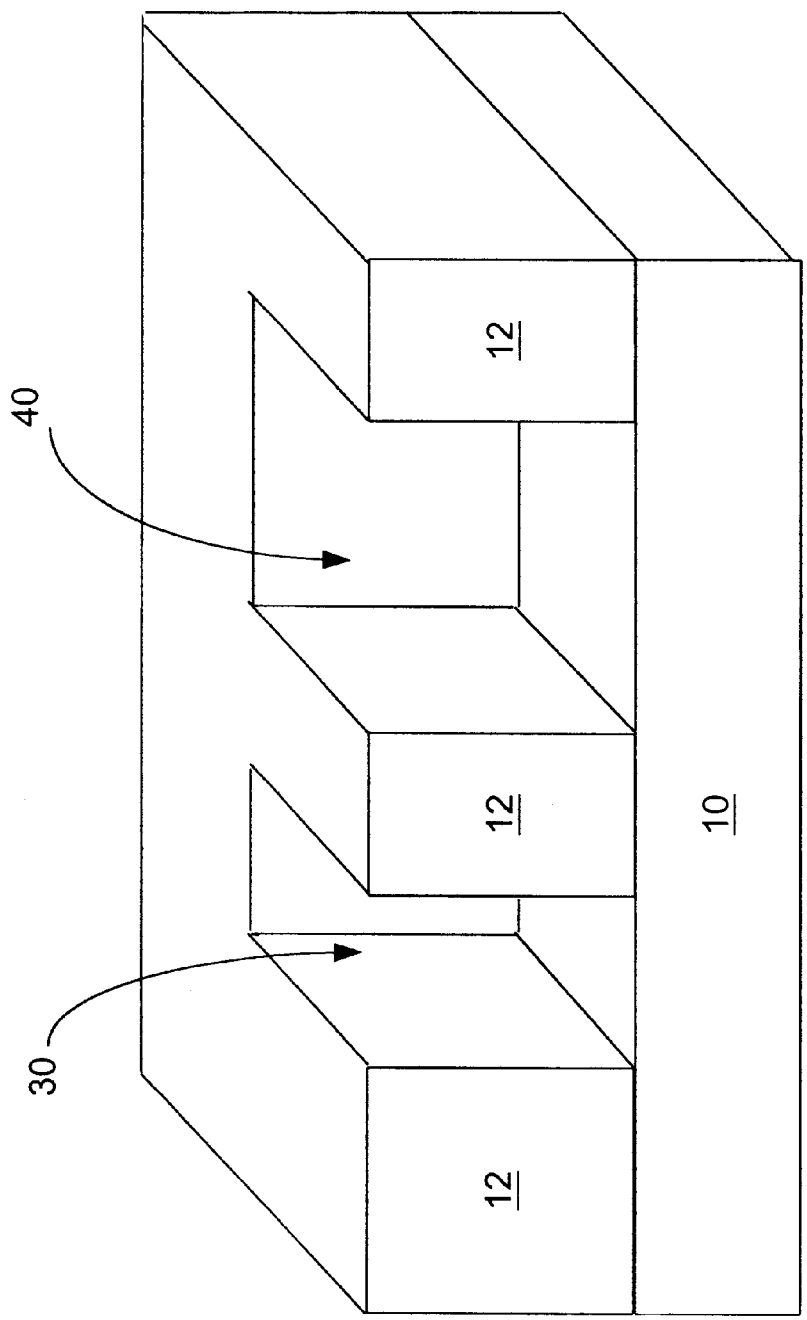
FIG. 1B is a three-dimensional cross sectional side view of the example mold layer and substrate illustrated in FIG. 1A illustrating how the mold layer can serve as an isolation barrier between the wells.
Figure 1C:
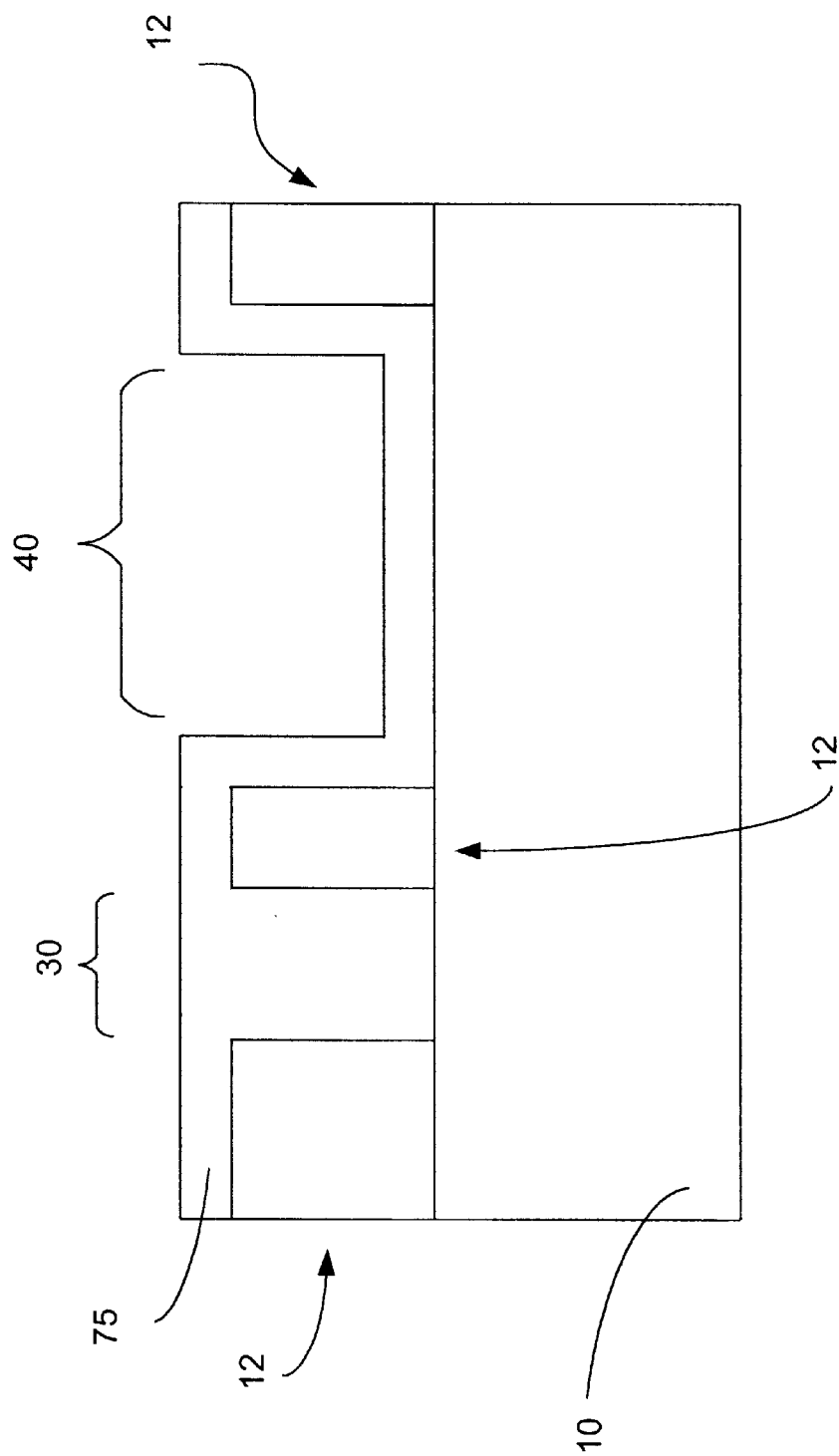
FIG. 1C is a cross sectional side view of an example step in the first selective deposition method of applying material on the mold layer surfaces depicted in FIG. 1A.

The present invention provides, among other things, methods for creating one or more structures in a micromachined device. These methods, the selective deposition methods, will now be described more fully hereinafter with reference to FIGS. 1A–8G, in which embodiments of the invention are shown. Each figure number represents a different embodiment of the selective deposition method. For example, eight embodiments are included (FIGS. 1–8). Figure letters represent non-limiting example steps within each embodiment. For example, FIGS. 1A, 1C, and 1D illustrate three steps within the first embodiment, wherein FIG. 1B is a three-dimensional, cross-sectional illustration of FIG. 1A. This invention can, however, be embodied in many different forms and should not be construed as limited to the embodiments set forth herein; rather, these embodiments are provided so that this disclosure will be thorough and complete, and will fully convey the scope of the invention to those skilled in the art. Furthermore, all "examples" given herein are intended to be non-limiting.

FIG. 1A is a cross sectional side view of an example step in the first selective deposition method of forming a mold layer 12 with high and low aspect ratio wells (30 and 40, respectively) on top of a substrate 10. Note that applying and depositing, or applied and deposited, or the like, will be used interchangeably throughout this document and will be understood to have the same or substantially the same meaning as is understood to those of ordinary skill in the art. Furthermore, it will be understood that the term wells is used to identify substantially any well, trench, or cavity. The substrate 10 can be the base material in a micromachining fabrication process. Various types of substrates are possible candidates, depending on the application of the final structure. For example, the substrate 10 can be either conductive (i.e. strong capability of conducting electricity), semi-conductive (i.e. an intermediate ability to conduct electricity), or non-conductive (i.e. an insulator, or unable to conduct electricity). A non-conductive substrate can be coated with an adhesion layer (for example Ti/Cu) that provides an improved contact for deposition on the substrate by a subsequent operation and electrical continuity. If the substrate 10 is by nature conductive, the adhesion layer can be optional (even though it can greatly enhance the mechanical interface between the substrate 10 and the structures deposited on top of the substrate 10). If the substrate 10 ultimately serves as a contact for connection to the finished structure from other external devices, such as in devices and micro-systems based on electromagnetic phenomena, a preferred substrate 10 material can include a NiFe permalloy, although other magnetic materials can be used, including for example, CoNiFe, if desired. In the latter case, the substrate 10 can be coated with an insulating layer which serves to insulate the substrate 10 from the material added on top of the substrate 10, as will be described in greater detail below.

The mold layer 12 can be comprised of a non-conducting material, conductive material, or semi-conductive material. Preferably, the mold layer 12 will be made using a photosensitive polymer that yields desirable molds with quasi-vertical side-walls 14 and high and low aspect ratio wells 30 and 40, respectively, as described below. Although photosensitive polymers can be difficult to dissolve and/or remove via wet etch techniques, according to the disclosed selective deposition method, the mold layer 12 can be allowed to remain integrated into the final structure. A further benefit of using a polymer based mold layer 12 is that the materials in the wells 30 and 40 can be spatially and electrically isolated from each other, separated by the non-conductive mold layer 12. FIG. 1B is a three-dimensional cross sectional view of the example mold layer 12 and the substrate 10 of FIG. 1A illustrating how material deposited in wells 30 and 40 can be spatially and/or electrically isolated. This isolation feature is especially valuable for electrical and/or electromechanical devices. In other embodiments, the mold layer 12 may be created in a manner whereby the mold layer wells are not isolated, allowing for material in wells 30 and 40 to interact. The mold layer 12 creating step is preferably implemented using photolithography, but other mold layer 12 forming methods can be used, including but not limited to x-ray lithography, or laser ablation. A variety of polymer micromolding techniques, such as photoresists, dry-etched polyimide, and thick, negative tone epoxy resists are suitable candidates. A key characteristic of this mold layer 12 forming step in the selective deposition method is that a mold layer 12 is formed with varying aspect ratio wells 30 and 40. The aspect ratio of a well is the geometrical ratio of its height to its width. Thus, with wells of the same depth, the high aspect ratio well 30 will be narrower than the low aspect ratio well 40. A flat and "opened" surface (parallel to the substrate 10), such as flat surface 16, can be considered as a limit for ultra low aspect ratio wells: the ratio just tends to zero. As will be described in greater detail below, this key characteristic enables the selective deposit and removal of material without the need for additional lithographic steps. Note that, although two wells 30 and 40 are illustrated, mold layers 12 with greater or fewer wells are within the scope of the present disclosure.

FIG. 1C is a cross sectional side view of an example step in the first selective deposition method of applying, or depositing, material 75 on the mold layer 12 surfaces (including depositing in wells 30 and 40). The depositing can occur by any known, or combination of known, methods, including but not limited to, conformal coating or plate through mold techniques. Preferably, the deposition occurs using conformal coating techniques, like physical vapor deposition (PVD), including but not limited to electroplating, electroless plating, chemical vapor deposition (CVD) or PECVD techniques (polysilicon), or similar techniques not enumerated above. Conformal coating provides for the application of material, such as material 75, normal to every surface of the mold layer 12 simultaneously and preferably in the substantially same amount. Material 75 that coats any surface other than in the high aspect ratio well 30 results in a collective amount of material 75 that is much thinner than that in the high aspect ratio well 30. For example, as noted on FIG. 1C, mold layer 12 walls on each side of the higher aspect ratio well 30 are closer together than mold layer walls on each side of low aspect ratio well 40. Thus, despite a conformal coat of material 75 on all of the mold surfaces, the proximity of mold layer walls on each side of the high aspect ratio well 30 causes the material 75 on the mold layer wall on the one side of the high aspect ratio well 30 to abut against the material 75 on the mold layer wall on the other side of the high aspect ratio well 40. This results in wells with higher aspect ratios (i.e. thinner well 30) being filled with the deposited material 75 before wells with lower aspect ratios (i.e. wider well 40). Almost any material (including conductive, non-conductive, and semi-conductive material) can be used for deposit into the wells 30 and 40, depending on the structure desired. Further, a seed layer (not shown) can be used to enhance the coating surface if metal material is deposited. The seed layer is typically a metal, preferably Cu or Ti, or successive layers of both metals, but other materials can be used, including but not limited to gold, aluminum, and chrome. In other embodiments, the seed layer can be omitted if the subsequent material deposited is non-conductive.

FIG. 1D is a cross sectional side view of an example step in the first selective deposition method of etching back the material 75 deposited on the mold layer 12 surfaces in FIG. 1C. The selective deposition method performs an isotropic blanket etch-back (for example, a highly selective wet etch in a well stirred bath) sequence of material previously deposited in a conformal fashion. The selectivity pertains to at least the mold layer 12 and to deposited material where the effects of etching are to be mitigated. Dual arrow 80 denotes an isotropic etch back process. The etch back can alternatively be performed using another isotropic or an anisotropic removal step including, but not limited to, chemical-mechanical polishing or reactive-ion etching. Because of the different aspect ratio wells 30 and 40, material 75 from the low aspect ratio well 40 will be the first to be completely removed. In other words, the material is "selectively" removed from lower aspect ratio well 40 and flat opened surfaces, such as flat surface 16, in the field of the mold layer 12, without the need for a lithographic step. Since this selective deposition method provides for a self-aligned, single mask step, this feature reduces the problems associated with re-aligning lithographic masks. Also note that the material 75 in the high aspect ratio well 30 can be spatially and/or electrically isolated from the same or different material in an adjacent well, such as low aspect ratio well 40.

Figure 2A:
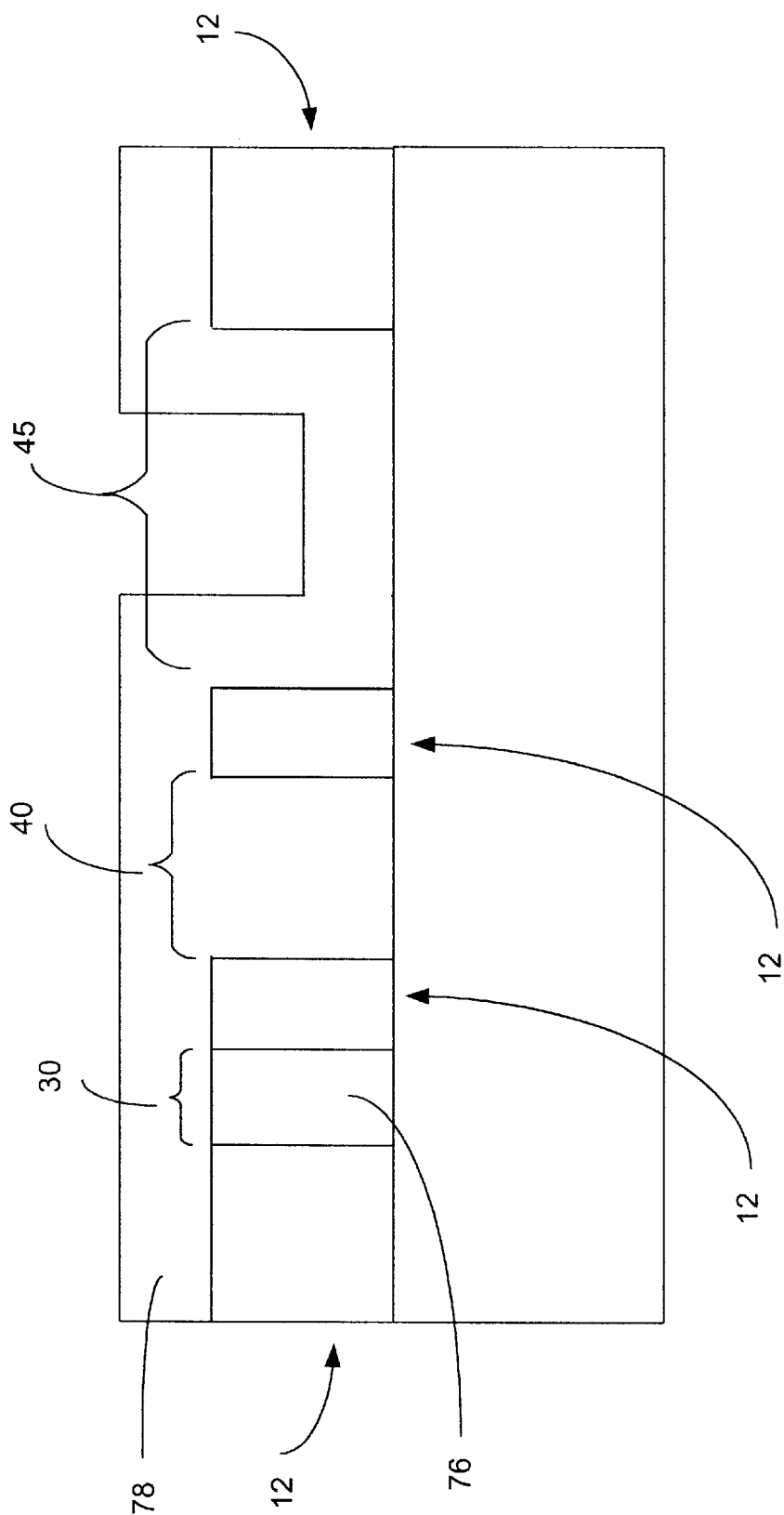
FIG. 2A is a cross sectional side view of an example step in a second selective deposition method of sequentially filling different wells with different materials.
Figure 2B:
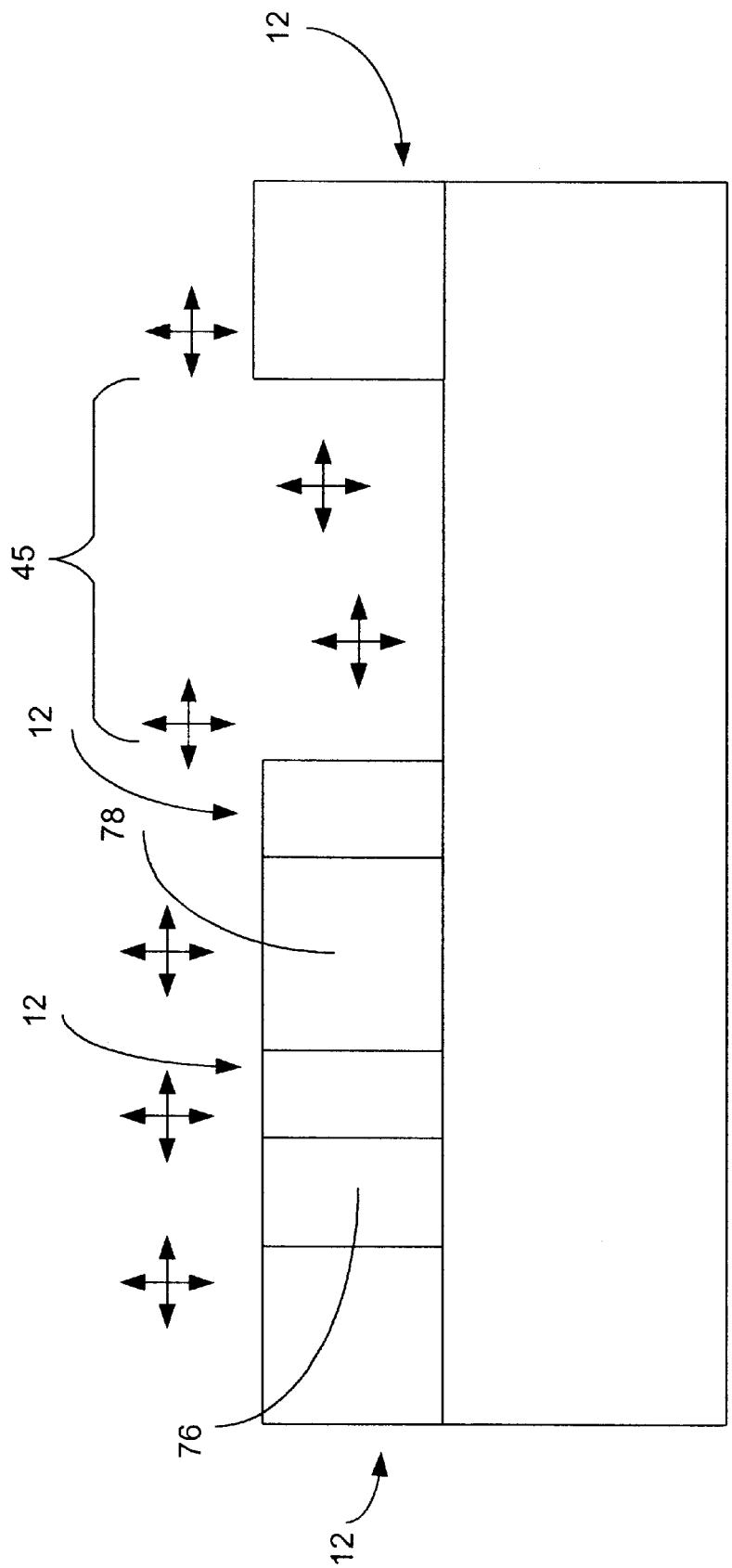
FIG. 2B is a cross sectional side view an example step in the second selective deposition method of etching back the materials added on the mold layer surface depicted in FIG. 2A resulting in two wells filled with different materials.

FIG. 2A is a cross sectional side view of an example step in the second selective deposition method of sequentially filling different wells with different materials, in accordance with a second embodiment of the invention. Note that another well 45 is identified in FIG. 2A to illustrate the second embodiment of the selective deposition method. As noted, once the highest aspect ratio well 30 is filled with material 76, the next highest ratio well 40 can be filled in a similar fashion with material 78. The remaining lowest aspect ratio well 45 can then be "opened" once the complete isotropic etch back sequence is performed as illustrated in FIG. 2B. This procedure can be repeated for any number of materials.

Figure 3A:
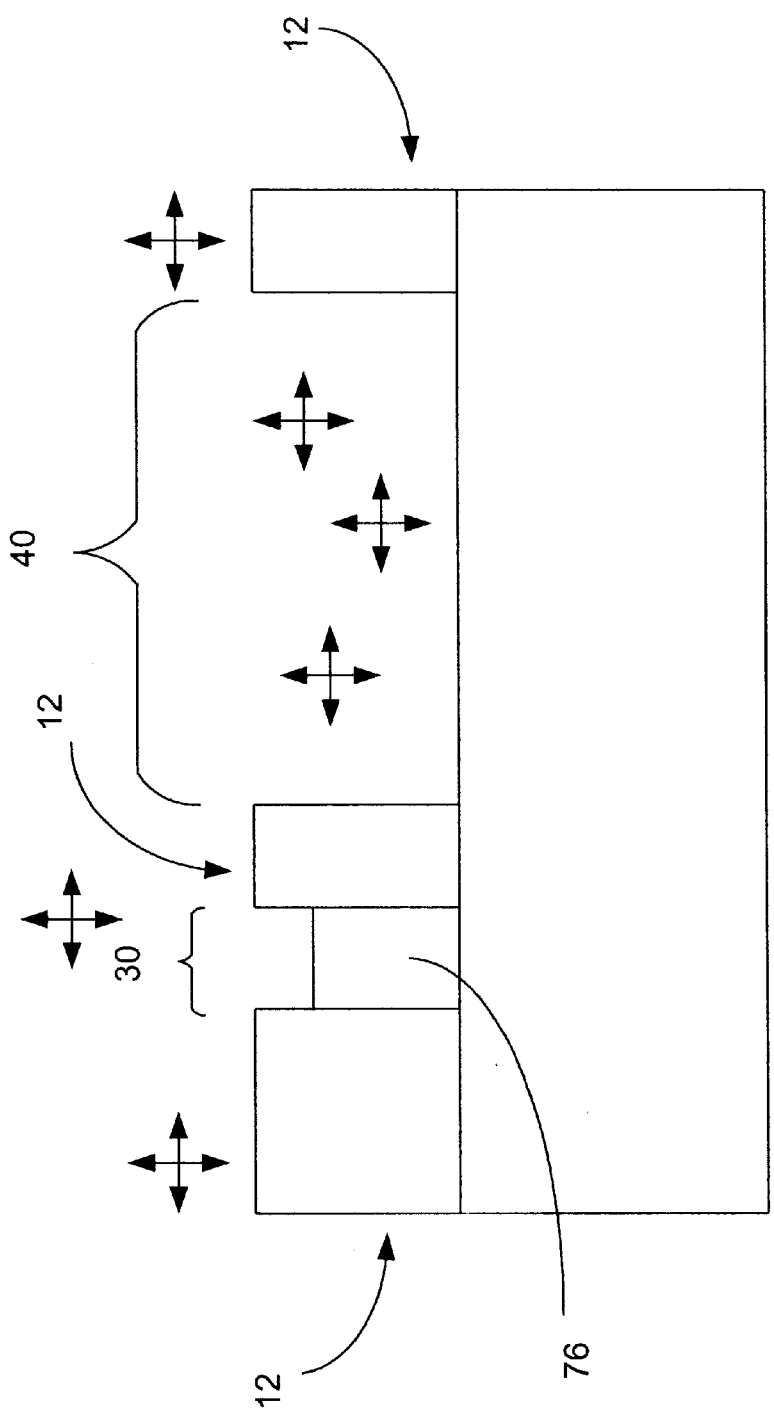
FIG. 3A is a cross sectional side view of an example step in a third selective deposition method of etching back a first material in a single well to make room for the addition of a second material in the same well.
Figure 3B:
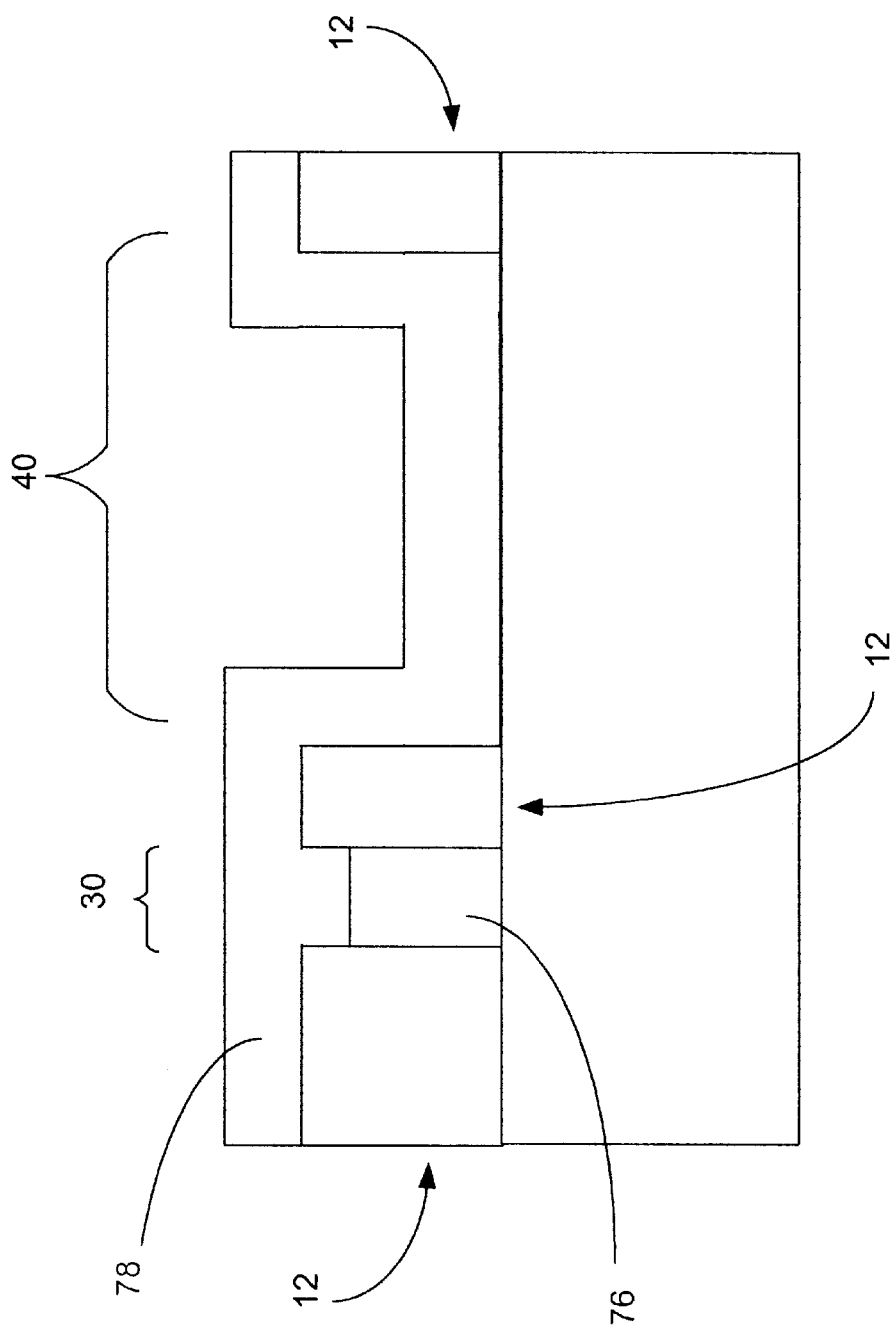
FIG. 3B is a cross sectional side view of an example step in the third selective deposition method of applying a second material on the mold layer surface and the first material depicted in FIG. 3A.
Figure 3C:
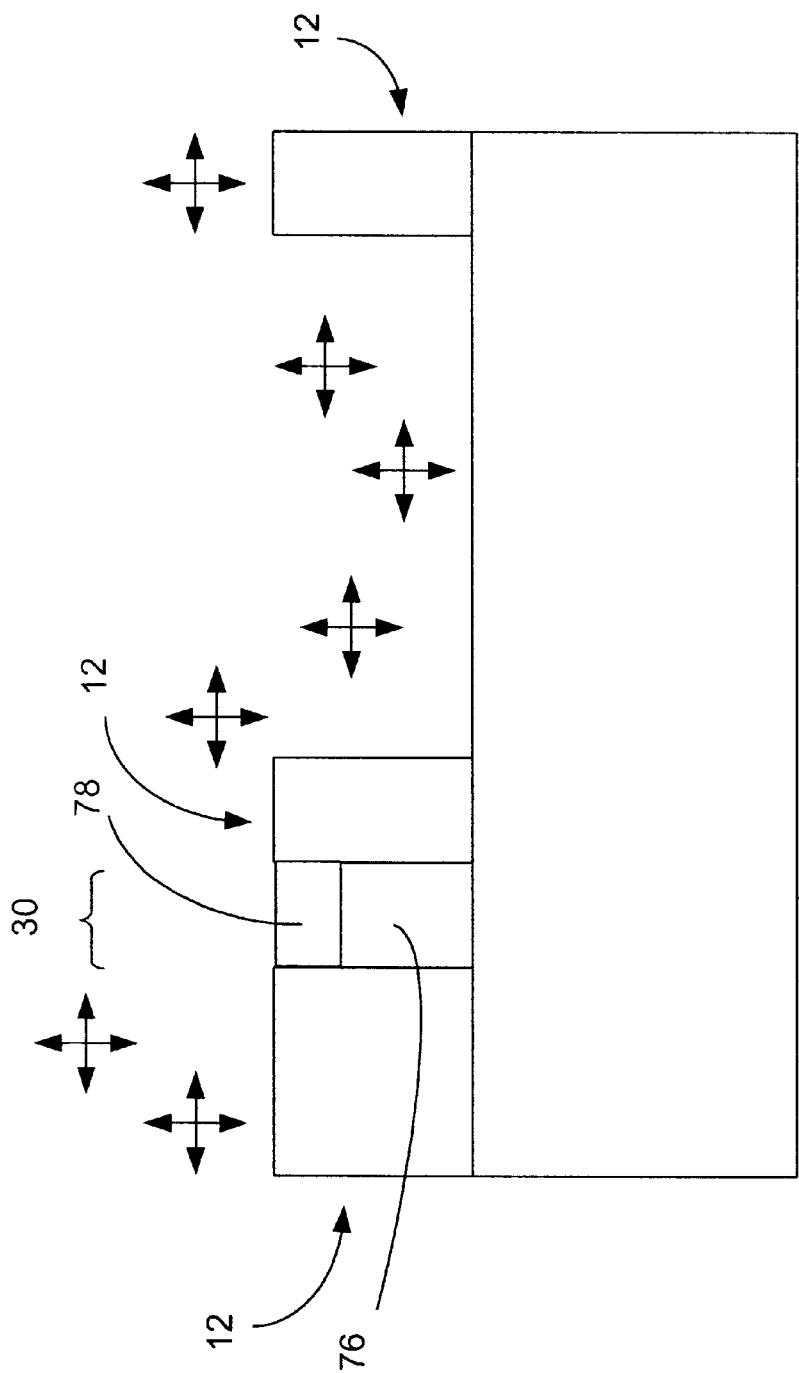
FIG. 3C is a cross sectional side view of an example step in the third selective deposition method of etching back the second material applied in FIG. 3B resulting in the deposit of the second material on top of the first material in the same well.

FIG. 3A is a cross sectional side view of an example step in the third selective deposition method of etching back a first material in a single well to make room for the addition of a second material in the same well. Assume material 76 has been deposited in high aspect ratio well 30. Material 76 can be further etched back from the higher aspect ratio well 30 to create a surface for depositing a second material. As illustrated in FIG. 3B, second material 78 is deposited without the need for an added lithographic step. Second material 78 can then be etched back in the manner as described earlier to create stacked materials 76 and 78 in a single high aspect ratio well 30, as illustrated in FIG. 3C. Similarly, a plurality of materials can be stacked in a single high aspect ratio well.

Figure 4:
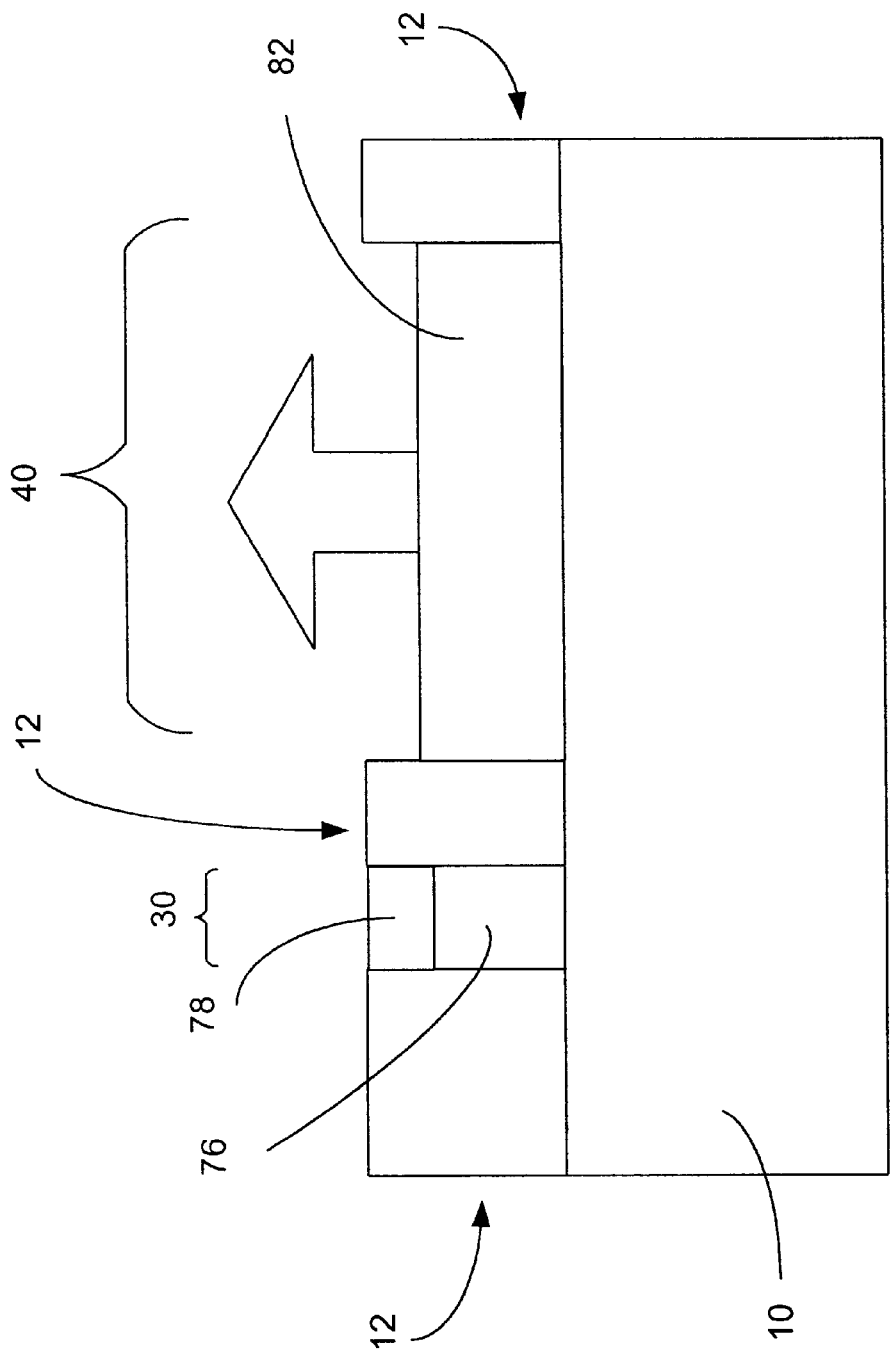
FIG. 4 is a cross sectional side view of an example step in a fourth selective deposition method of applying material with plate through mold techniques.

FIG. 4 is a cross sectional side view of an example step in the fourth selective deposition method of depositing material with plate through mold techniques. Once the high aspect ratio well 30 is filled and the low aspect ratio well 40 is "reopened" via the isotropic blanket etch, the low aspect ratio well 40 can be filled by electrodeposition techniques, a screen-printing method, or other techniques including, but not limited to, conformal coating techniques. As a non-limiting example, material 82 can be electrodeposited in a "plate-through-mold" fashion in "opened," low aspect ratio well 40 if: (1) materials 76 and 78 stacked into the high aspect ratio well 30 are electrically insulated from the substrate 10. For example, first material 76 in high aspect ratio well 30 can be an electrical insulator, or an additional electrical insulating layer can be added (not shown); and/or (2) the last material 78 filling the high aspect ratio well 30 is either an insulator and/or is not likely to be affected by the electrolyte for material 82 electrodeposition (e.g. corrosion). In addition, the "plate-through-mold" technique can be expanded to include the formation of "hats," composed of material 82, on top of the last material, 78, as the application demands. If material 78 is conductive and electrically coupled to the substrate 10, then when material 82 is electrodeposited by the "plate-through-mold" method, it will also be deposited on the upper-most 78 material, thus forming a "hat" (not shown). Alternatively, these steps can work in reverse, wherein the electrodeposition steps (or even screen plating steps) occur before the conformal coating steps.

Figure 5A:
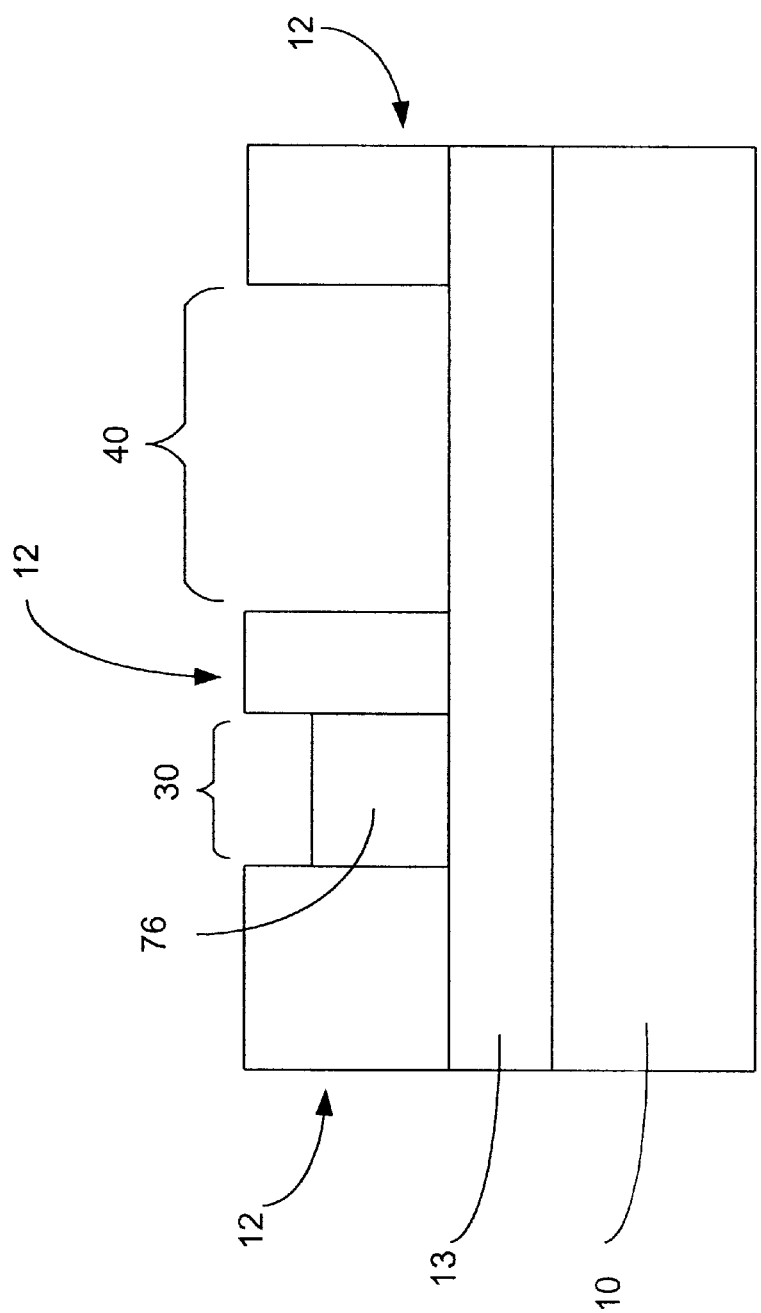
FIG. 5A is a cross sectional side view of an example step in a fifth selective deposition method of applying an insulating layer on a conductive substrate, forming a mold layer, and applying material in a well in the mold layer.
Figure 5B:
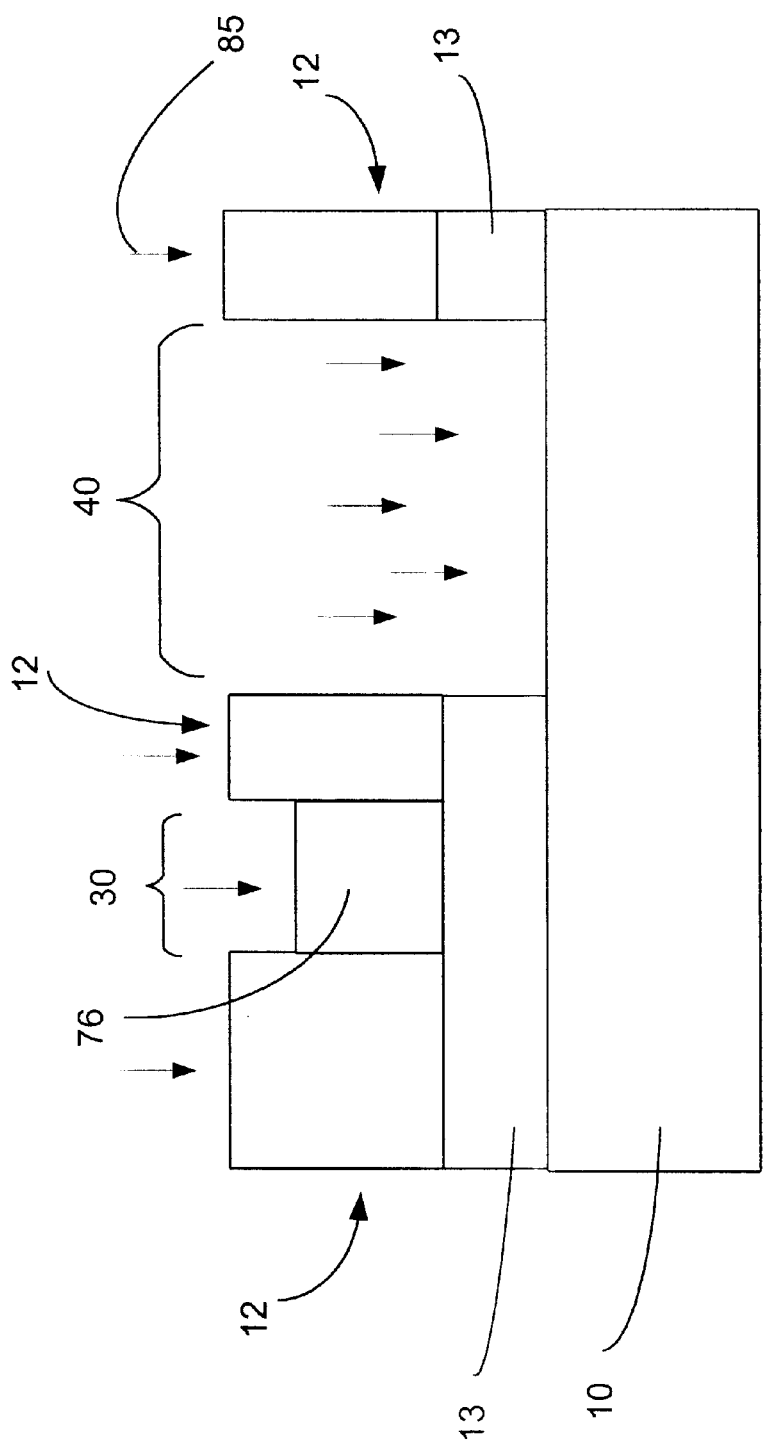
FIG. 5B is a cross sectional side view of an example step in the fifth selective deposition method of etching back the insulating layer depicted in FIG. 5A.

FIG. 5A is a cross sectional side view of example steps in the fifth selective deposition method of depositing an insulating layer 13 on a conductive substrate 10, forming a mold layer 12, and depositing material 76 in a well in the mold layer. As an example, the insulating layer 13 can be a thin layer of polymer, spun on top of the conductive substrate 10. Possible polymer materials include those used for the mold layer 12, as described previously. The mold layer 12 is then built on top of the insulating layer 13. Material, such as material 76, can then be deposited as described earlier. Insulating layer 13 creates a physical and/or electrical and/or chemical separation between material deposited in the wells, such as material 76 in high aspect ratio well 30, and the actual surface of the conductive substrate 10. Once the low aspect ratio wells, such as low aspect ratio well 40, are "re-opened" (for example, by an isotropic etch back), the thin insulating layer 13 can be etched via the openings provided by the "opened" low aspect ratio wells 40, as illustrated in FIG. 5B. Note that the insulating layer 13 is preferably thin enough to minimize the etching effects on the mold layer 12 and to reduce the etch back duration. The etch can be accomplished by a wet etch, or preferably by a self-aligned blanket dry etch as represented by single arrow 85. A plate-through-mold or screen printing technique can then proceed in order to fill low aspect ratio well 40 with material (not shown).

Figure 6A:
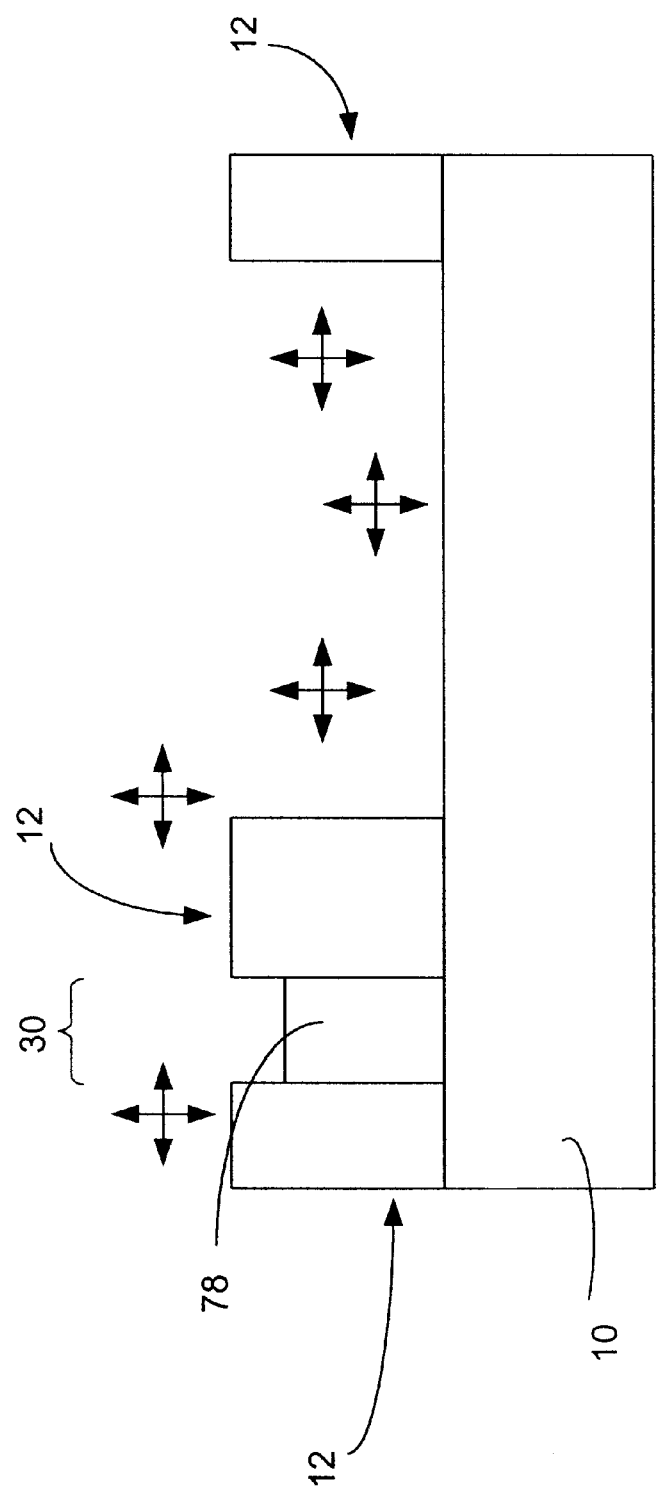
FIG. 6A is a cross sectional side view of an example step in a sixth selective deposition method of etching back a first material layer (ultimately the sacrificial layer) in a single well to make room for the deposit of another material.
Figure 6B:
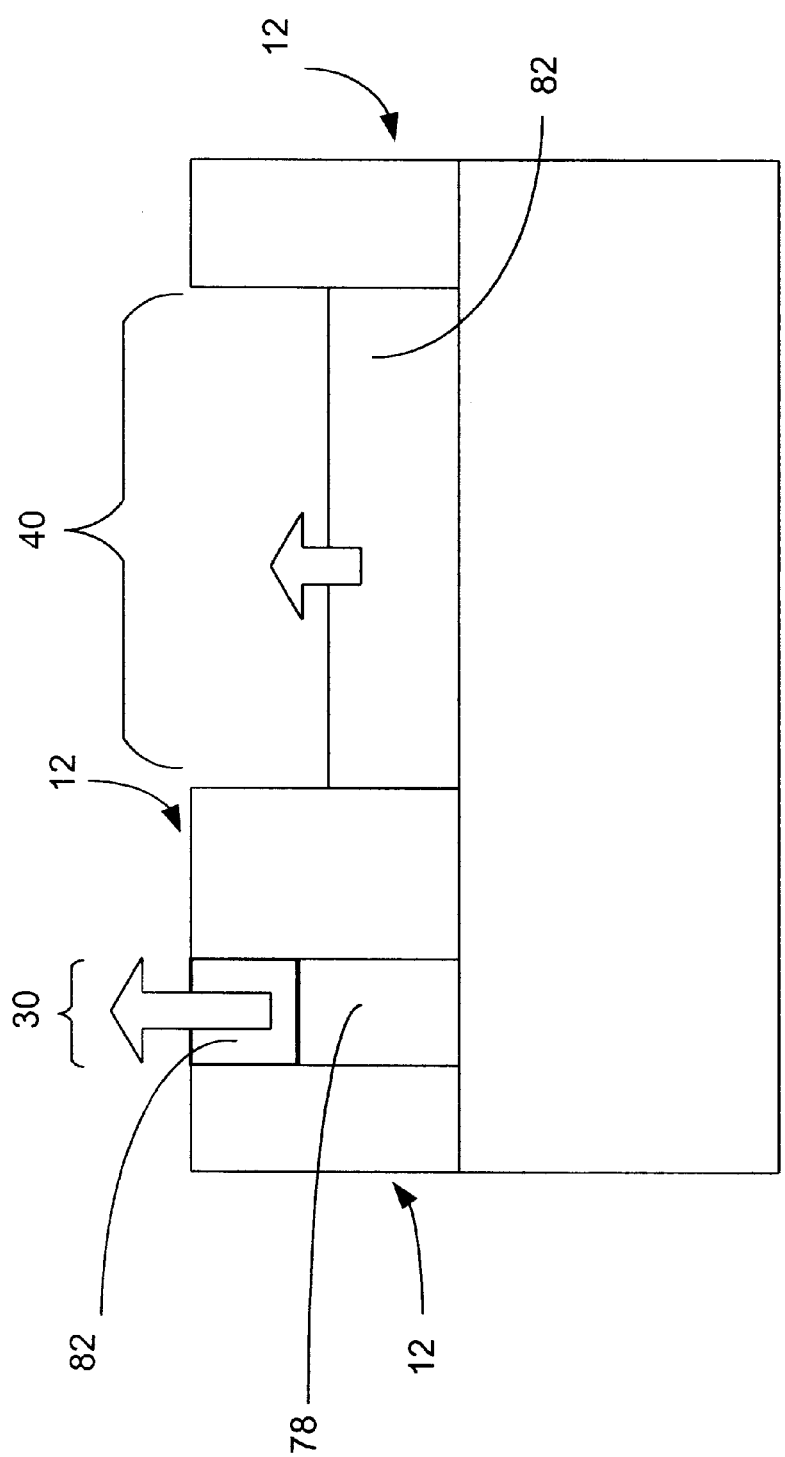
FIG. 6B is a cross sectional side view of an example step in the sixth selective deposition method of electrodepositing a second material on the mold layer surface and on top of the first material layer depicted in FIG. 6A.
Figure 6C:
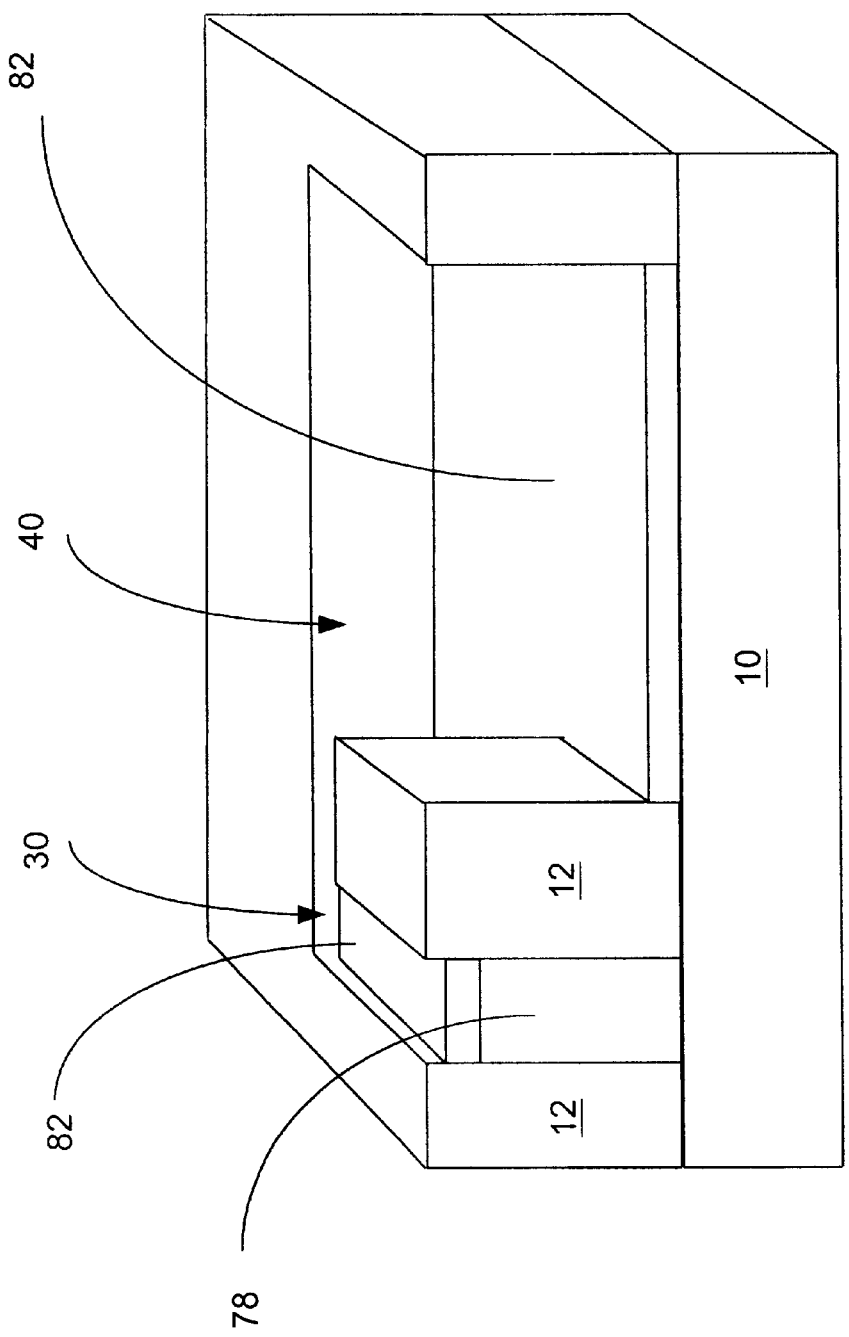
FIG. 6C is a three dimensional cross sectional side view of the example structure depicted in FIG. 6B illustrating that the second material layer illustrated in FIG. 6B is contiguous between wells.
Figure 6D:
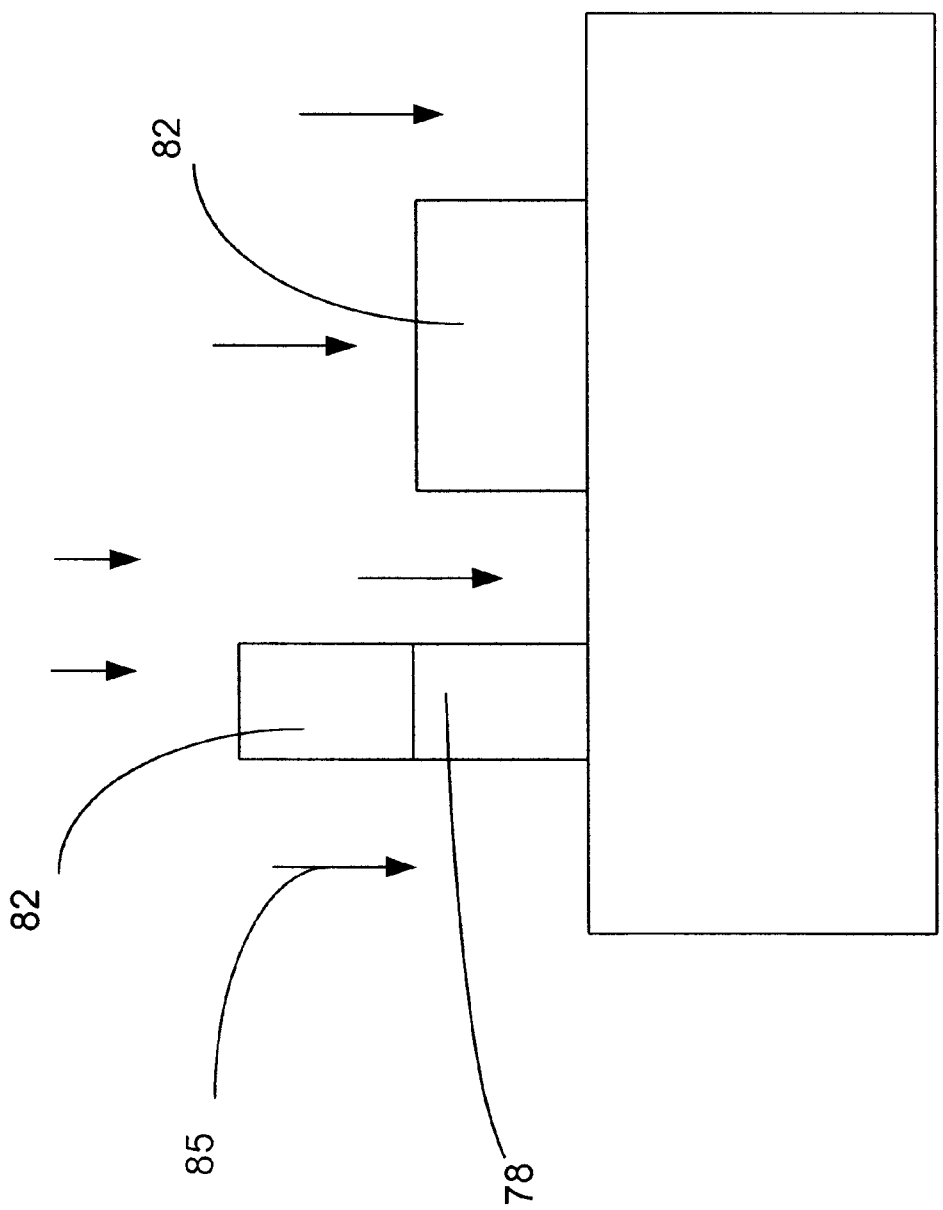
FIG. 6D is a cross sectional side view of an example step in the sixth selective deposition method of etching back the mold layer depicted in FIG. 6B.

FIGS. 6A–6D are cross sectional side views of example steps in the sixth selective deposition method used to create a sacrificial material layer. For example in FIG. 6A, once mold layer 12 is created on the substrate 10 (for example, either an electrically conductive substrate or a non-conductive one with conductive seed layers deposited on its surface), the conformal deposition and etching of material 78 in high aspect ratio well 30 proceeds in the same manner as described previously. The etch back proceeds until enough space remains above material 78 for the deposit of another layer of material. Referring to FIG. 6B, if material 78, deposited in high aspect ratio well 30, is conductive, then when material 82 fills low aspect ratio well 40 using electrodeposition steps (such as plate-through-mold or using screen-printing), material 82 will also be deposited in the high aspect ratio well 30 in the area above material 78. FIG. 6C is a three dimensional cross sectional view of the structure shown in FIG. 6B. Note that the mold layer 12 is created in such a manner that material deposited in high aspect ratio well 30 will not be isolated from material in low aspect ratio well 40. Thus, material 82 in high aspect ratio well 30 will be contiguous with material 82 in low aspect ratio well 40, allowing for the support of material 82 once material 78 is removed or "sacrificed", as described below. Alternatively, the support can be accomplished by the formation of "hats", as described with reference to FIG. 4 above. Mold layer 12 is then removed (using a selective removal step such as a selective isotropic or selective anisotropic step), as illustrated in FIG. 6D by anisotropic arrows 85. This exposes the sides of stacked materials 78 and 82. Material 78 can be subsequently removed by the same or an additional appropriate selective removal step, as represented by isotropic arrows (depicted as arrows 86) in FIG. 6E. If material 82 is filled using plate-through-mold, then the completed structure after the sacrificial layer (i.e. material 78) is removed will be offset by the height of the sacrificial layers as illustrated in FIG. 6E. This means that the structure composed of material 82 need not be planarized, or rather, re-surfaced. On the other hand, if screen-printing is used, then the finished structure of material 82 will be planarized. Alternatively, a plurality of sacrificial material layers, instead of just a single material like material 78 (FIG. 6B), can also be used in this scheme to create a stack of materials depending on the final structure desired. For instance, material 78 can be "sandwiched" between material 82 in high aspect ratio well 30 (FIG. 6B), and then material 78 can be selectively removed to create, for example, a switch with the two contact points located in the high aspect ratio well 30. Also note that material 82 is preferably not significantly sensitive to any etch used to remove the materials in the stack (for example, material 78 of FIG. 6B). An added benefit of this process is the ease with which thick sacrificial layers can be created, in the range of tens to hundreds of microns, depending upon the thickness of the mold layer 12 and the thickness of material 78 (FIG. 6B).

Figure 7A:
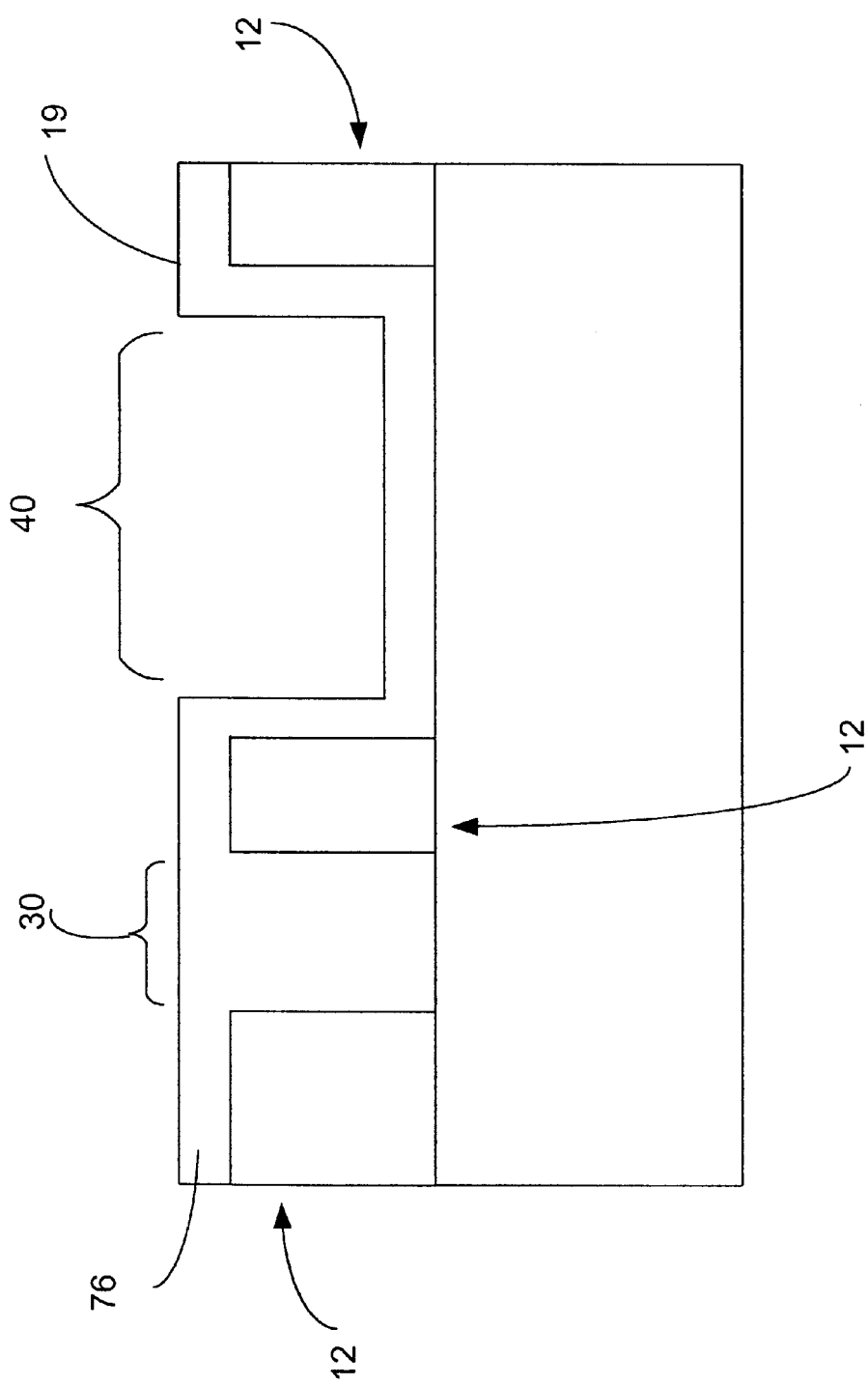
FIG. 7A is a cross sectional side view of an example step in a seventh selective deposition method of applying material on a mold layer surface.
Figure 7B:
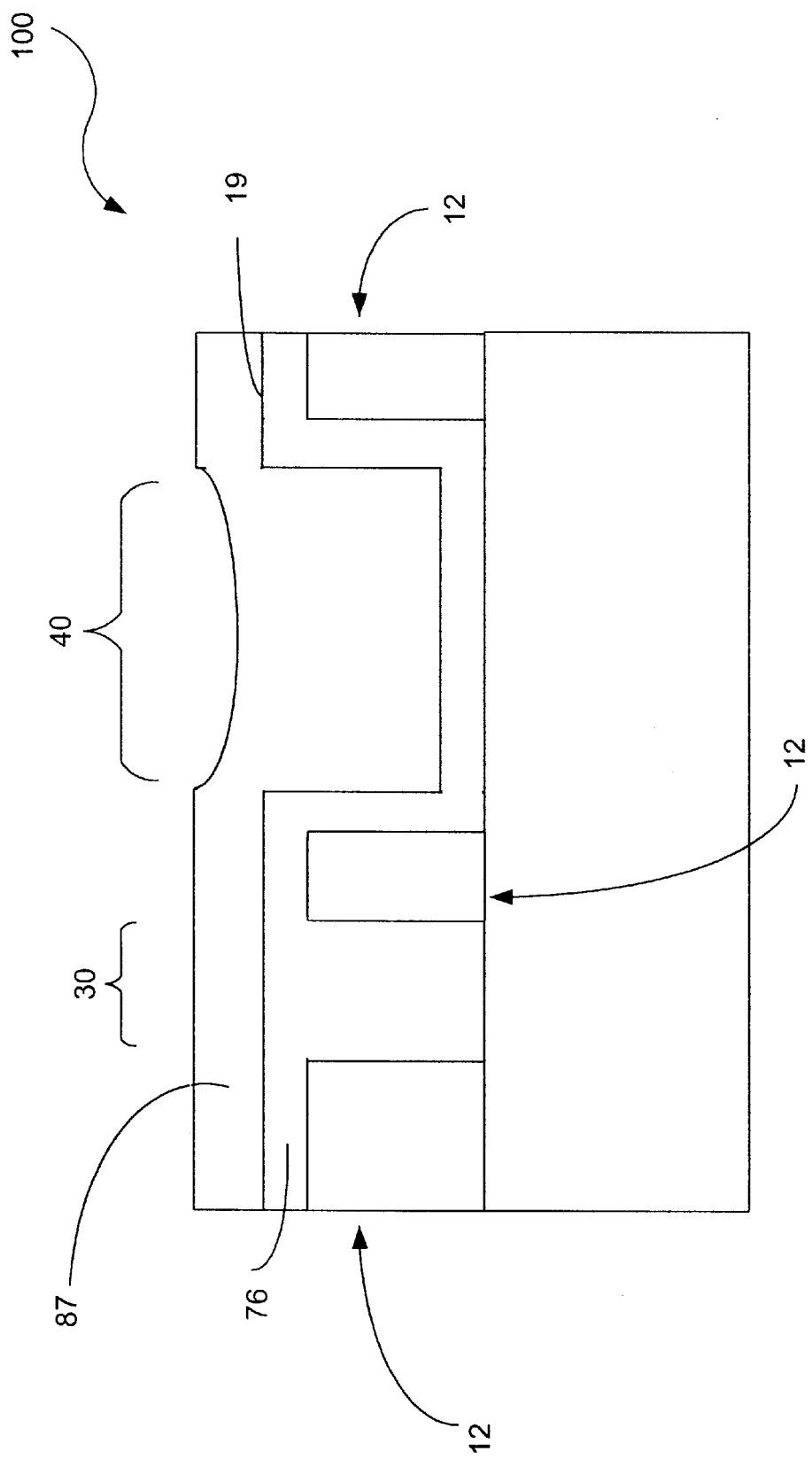
FIG. 7B is a cross sectional side view an example step in the seventh selective deposition method of applying a polymer on top of the material applied in FIG. 7A.
Figure 7C:
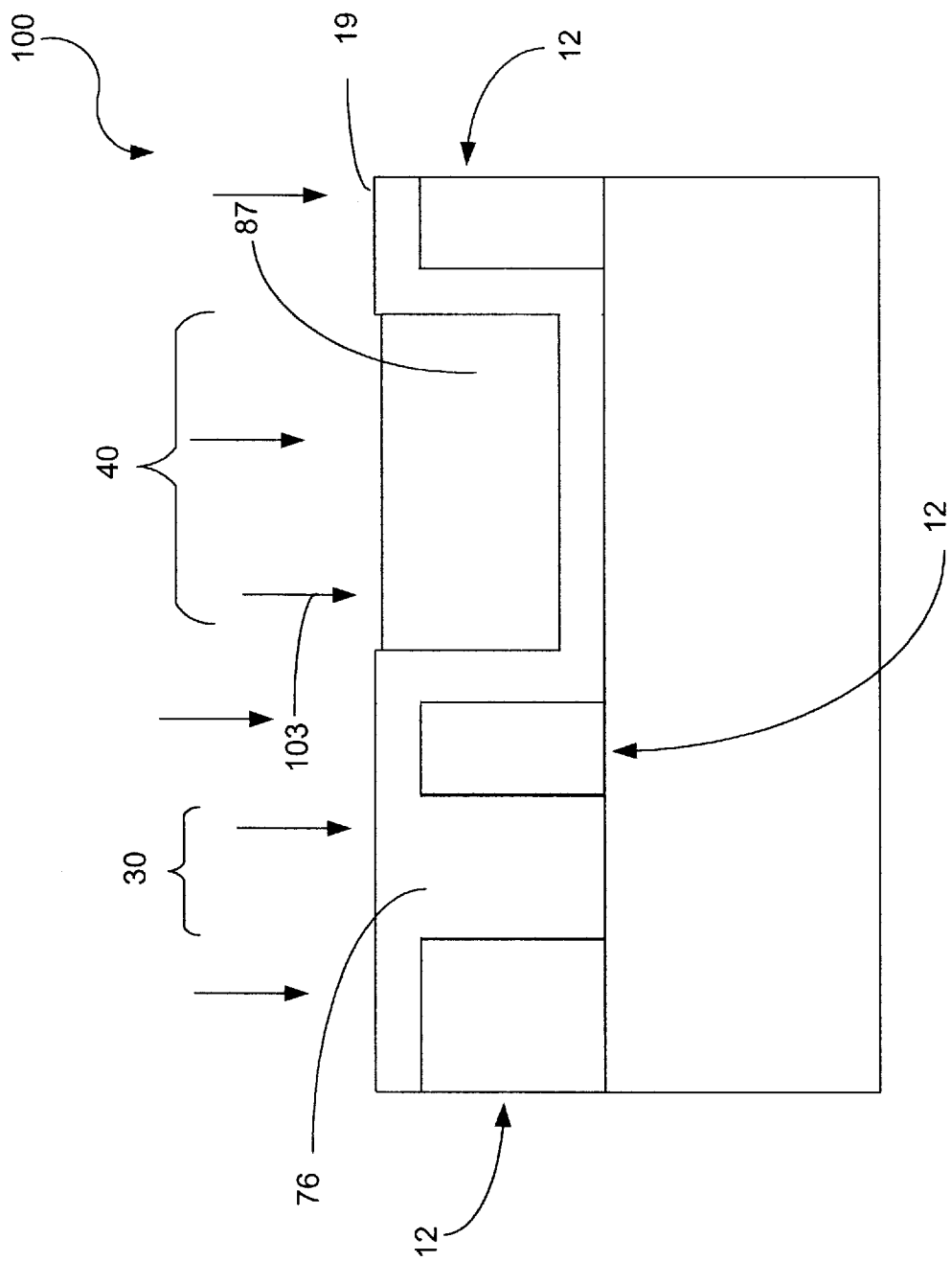
FIG. 7C is a cross sectional side view of an example step in the seventh selective deposition method of etching back the polymer deposited in 7B resulting in polymer left in the low aspect ratio well.

FIGS. 7A–7F are cross sectional side views of example steps in the seventh selective deposition method of increasing deposited material on the mold layer 12 surfaces while reducing the loss of previously deposited material. As described previously, and referring to FIG. 7A, mold layer 12 is coated with a conformal layer of electroplated material 76. Once the high aspect ratio well 30 is completely filled, the topology of the mold layer 12 is such that parts of the mold layer 12 that previously offered a high aspect ratio well 30 now offers a flat surface 19. Parts of the mold layer 12, such as partially filled low aspect ratio well 40 still present a topology. It is possible to fill any partially unfilled low aspect ratio well, such as low aspect ratio well 40, with a polymer using, for example, a mask-less screen printing technique, or other techniques including, but not limited to, spin casting. Referring to FIG. 7B, depending on the theological characteristics of the polymer 87, the polymer 87 will naturally accumulate in partially unfilled low aspect ratio well 40. As a result, any "upper" flat surfaces 19 will be naturally coated with a thinner amount of the liquid polymer 87, resulting in an electroplated/polymer structure 100. It is then possible to selectively remove the polymer 87 from the upper surfaces 19 by using one of a number of techniques, such as chemical-mechanical-polishing (CMP) or other plasma based techniques, for example blanket reactive ion etching (RIE) as illustrated in FIG. 7C. With CMP, the "upper surfaces" of the electroplated/polymer structure 100 can be altered first. With a blanket RIE etch, represented by directional arrows 103, the thin amount of polymer 87 remaining on the upper surfaces 19 will be depleted (removed) first. Thicker amounts of polymer 87 on the electroplated/polymer structure 100 should be thick enough so that, after the blanket etch, any wells left partially filled after the first conformal deposition of material 76 will still be filled and "buried" under the polymer 87.

Figure 7D:
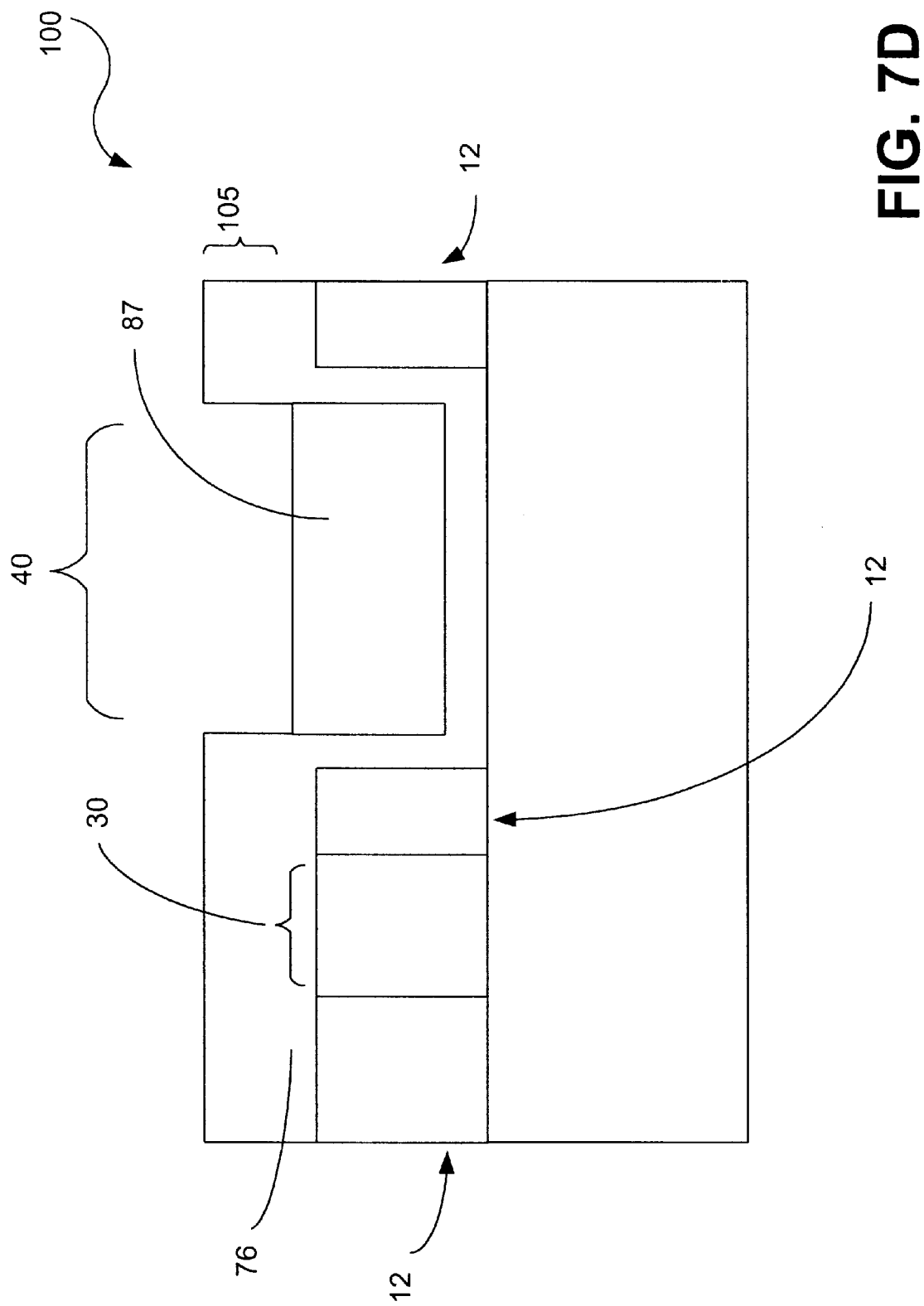
FIG. 7D is a cross sectional side view of an example step in the seventh selective deposition method of applying more of the initial material on top of the existing material deposited in FIG. 7A.
Figure 7E:
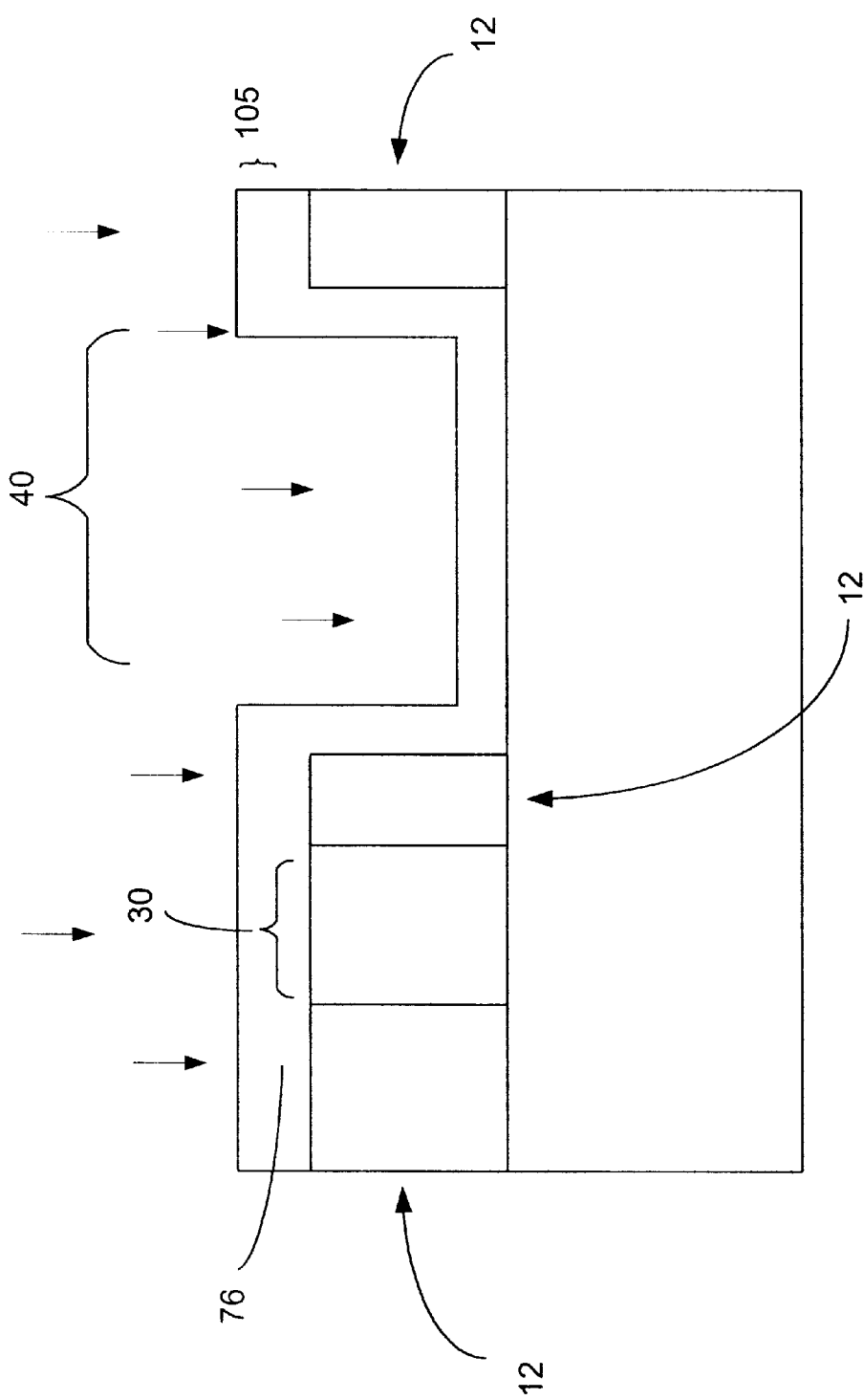
FIG. 7E is a cross sectional side view of an example step in the seventh selective deposition method of removing the polymer layer deposited in FIG. 7B.
Figure 7F:
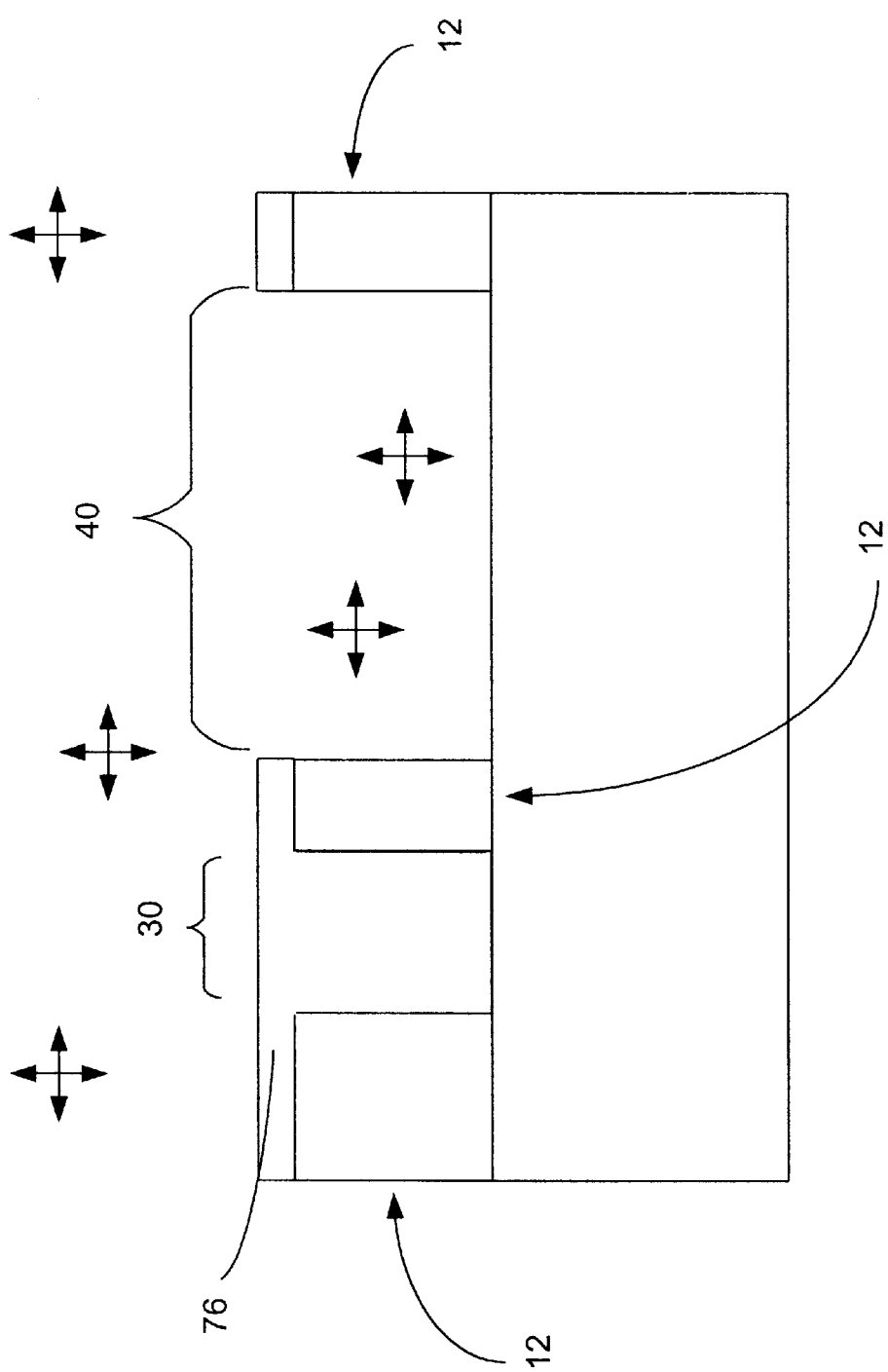
FIG. 7F is a cross sectional side view of an example step in the seventh selective deposition method of etching back the initial material added in the low aspect ratio well in FIG. 7A.

Referring to FIG. 7D, further electroplating can be performed on the upper flat surfaces 19 (FIG. 7C) to add an additional thickness layer 105. The polymer 87 left on the electroplated/polymer structure 100 prevents depositing in any previous wells left partially unfilled after the first conformal depositing of material 76, such as low aspect ratio well 40. The upper surfaces are consequently coated with a thicker layer 105 of material 76. The polymer 87 is then removed from the electroplated/polymer structure 100, as illustrated in FIG. 7E. The removal step is typically implemented using an acetone typically used for conventional photoresists, but removal may be accomplished using other techniques, including but not limited to blanket RIE. The process proceeds then as previously described. As illustrated in FIG. 7F, an isotropic etch is performed in order to remove material 76 from low aspect ratio well 40 first. Upper surfaces (i.e. the surface the added thickness layer 105 was deposited on) and parts of the mold that were offering high aspect ratio wells, such as high aspect ratio well 30, are protected under a thicker amount of material 76 (i.e. added thickness layer 105). As a result, it is possible to remove material 76 from low aspect ratio well 40 and keep a safe amount of material 76 on any other parts.

Figure 8A:
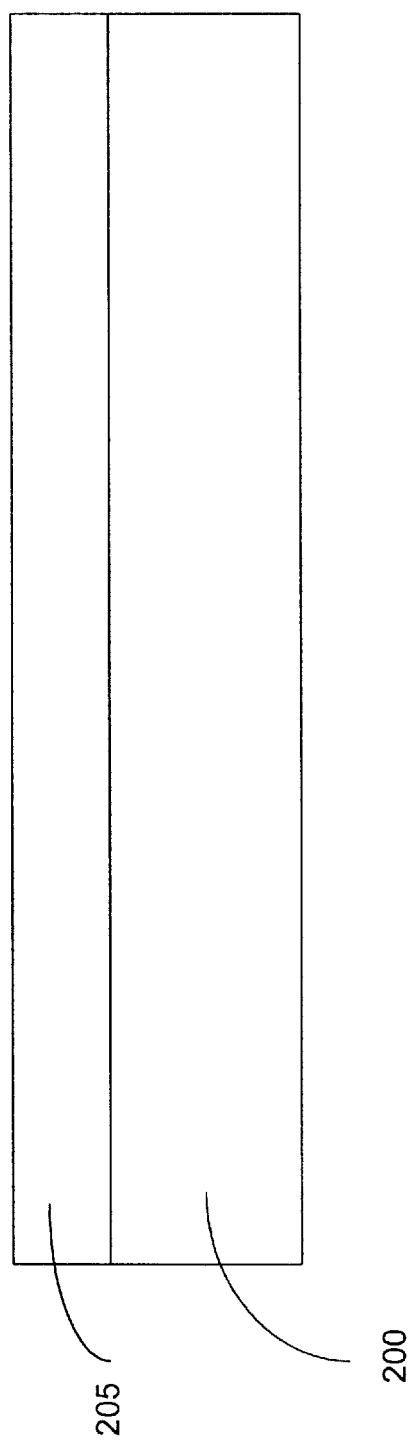
FIG. 8A is a cross sectional side view of an example step in an eighth selective deposition method of adding an electrical insulating layer to a substrate as part of a micromachined electromagnetic device.

FIGS. 8A–8G are cross sectional side views of example steps of the eighth selective deposition method of creating a micromachined electromagnetic device comprising a core structure and winding structure of different metal materials. FIG. 8A depicts a magnetic substrate 200, preferably NiFe (80%/20%), coated with a thin electrical insulating 205 layer of photoresist to electrically insulate the magnetic substrate. As described earlier, other magnetic materials can be used for the substrate 200, or the same materials in different composition ratios. The insulating layer 205 is preferably a photoresist material such as the well-known SU-8 or other photosensitive polymers. The insulating layer 205 is preferably pre-baked, cross-linked, and post-baked in order to create a uniform, stable isolation layer.

Figure 8B:
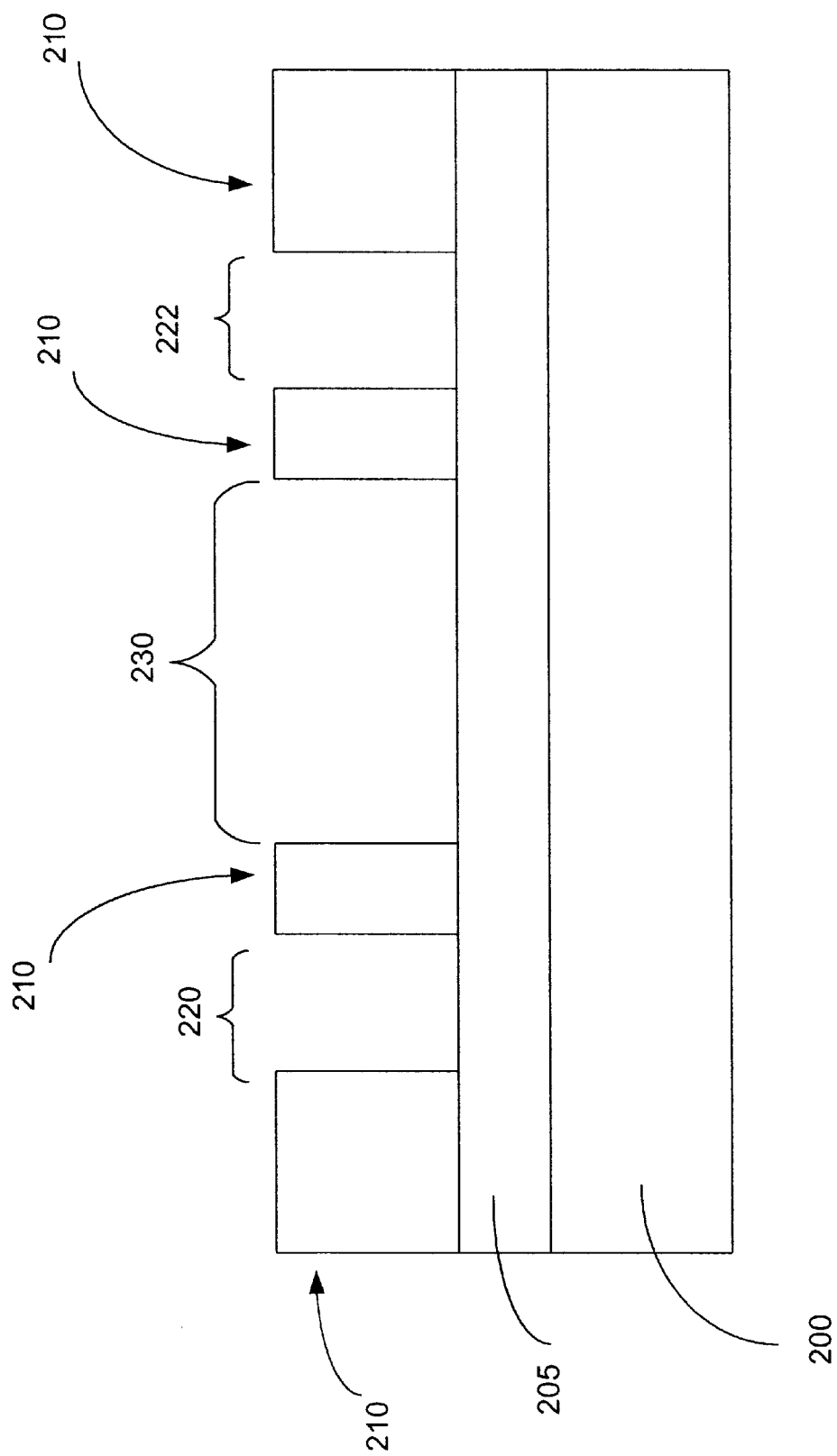
FIG. 8B is a cross sectional side view of an example step in the eighth selective deposition method of applying a mold layer with varying aspect ratio wells on top of the electrical insulating layer depicted in FIG. 8A.

FIG. 8B depicts the lithographic step of forming a mold layer on top of the electrical insulating layer 205. This step is preferably accomplished with photolithography, although other methods, as described in association with FIG. 1A, can be employed. The mold layer 210 comprises varying aspect ratio wells, including high aspect ratio wells 220 and 222 and low aspect ratio well 230. A key characteristic of this mold layer 210 forming step is that sections which will ultimately define winding structures are high aspect ratio wells 220 and 222, and the lower aspect ratio well 230, which will ultimately define magnetic core structures, are all provided in one mask step. A variety of polymer micro-molding techniques, such as photoresists, dry-etched polyimide, and thick, negative tone epoxy resists are suitable candidates. Preferably, this mold layer 210 is made out of photosensitive polymner, such as SU-8 photosensitive epoxy.

Figure 8C:
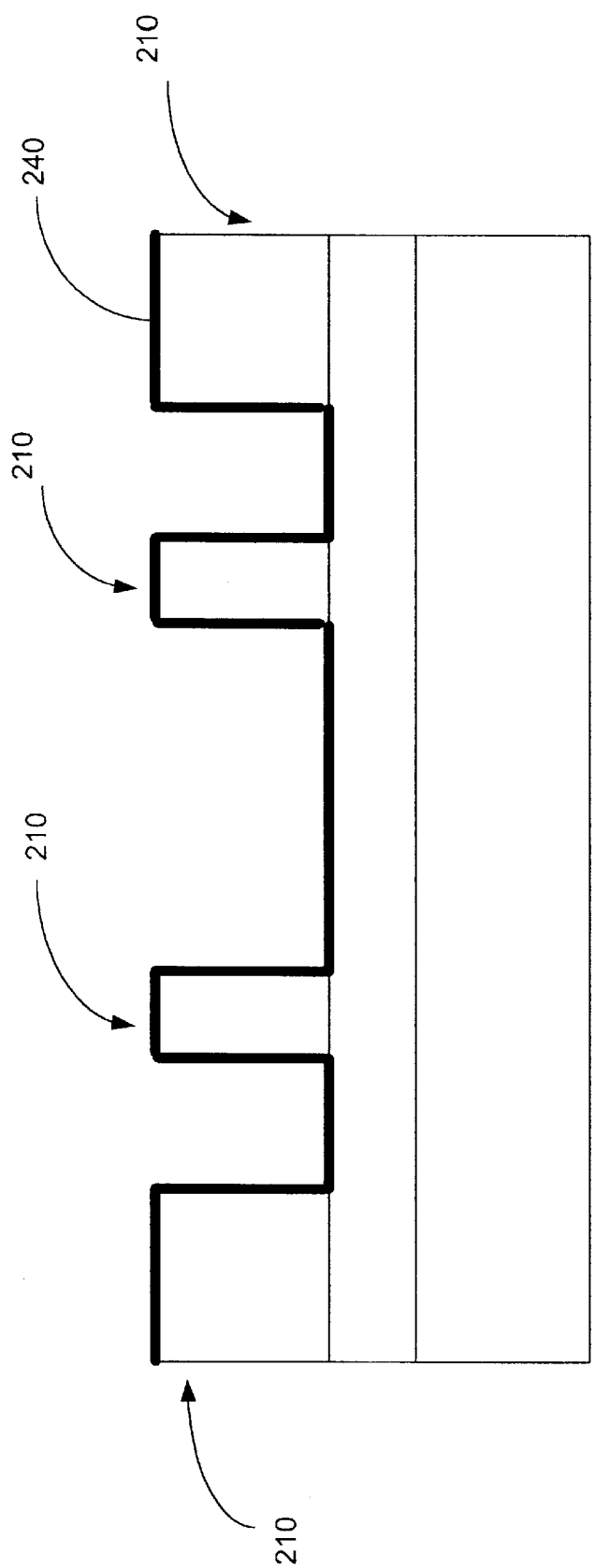
FIG. 8C is a cross sectional side view of an example step in the eighth selective deposition method of applying a seed layer onto the mold layer surface depicted in FIG. 8B.

FIG. 8C illustrates the step of conformal coating the mold layer 210 surfaces with a seed layer 240 of, preferably, Ti/Cu/Ti (100 nm/1000 nm/100 nm) using physical vapor deposition (PVD). The seed layer 240 provides the mold layer 210 with an enhanced plating surface for subsequent metal deposition. Alternatively, other conductive materials for the seed layer 240 can be used, or the same materials in different thickness, alone or in combination. Further, as described earlier, alternate conformal or other coating techniques can be used as well, including but not limited to PVD, electroplating, electroless plating, or chemical vapor deposition (CVD) or PECVD techniques (polysilicon).

Figure 8D:
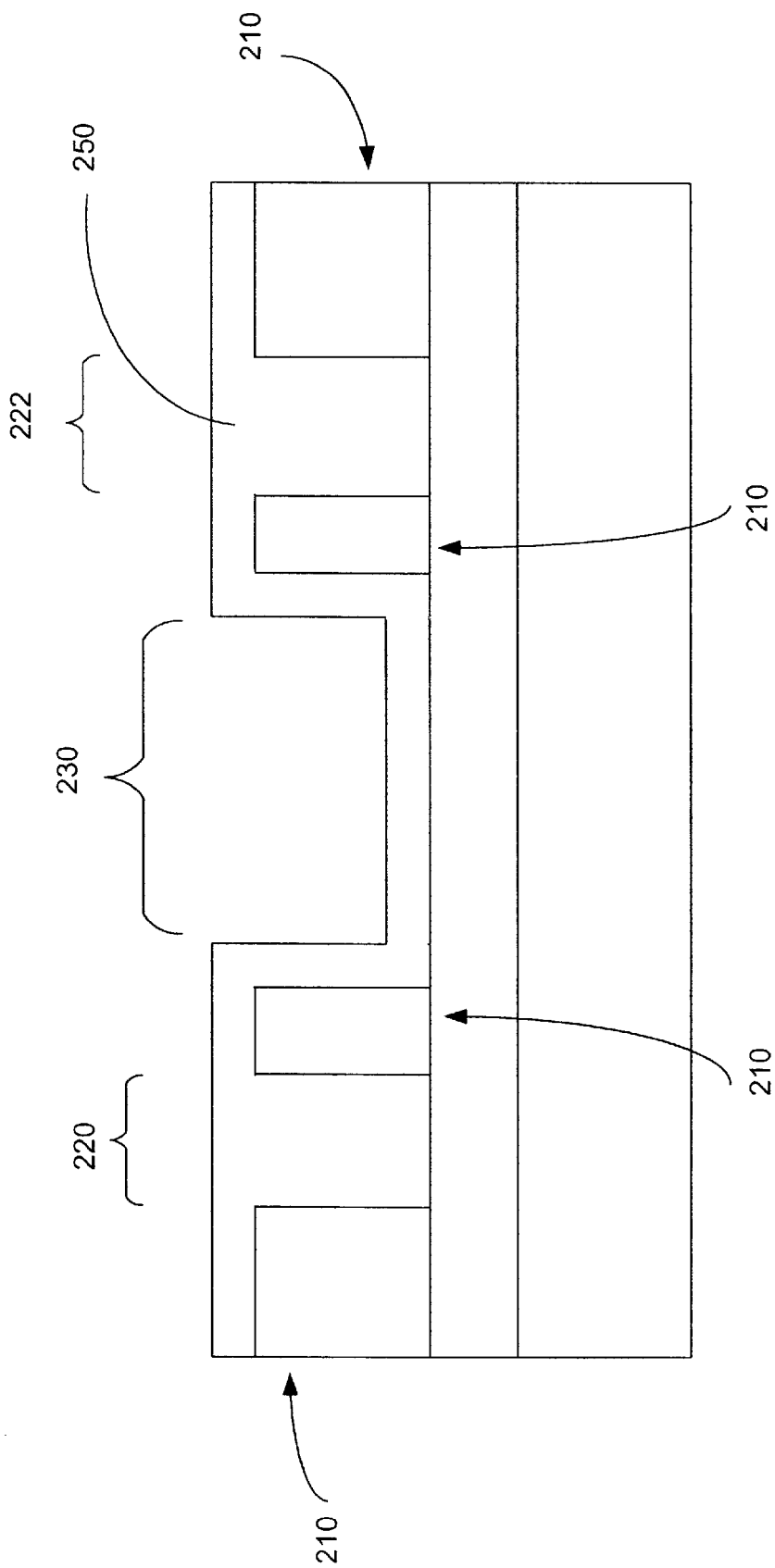
FIG. 8D is a cross sectional side view of an example step in the eighth selective deposition method of applying a first metal on top of the seed layer depicted in FIG. 8C.
Figure 8E:
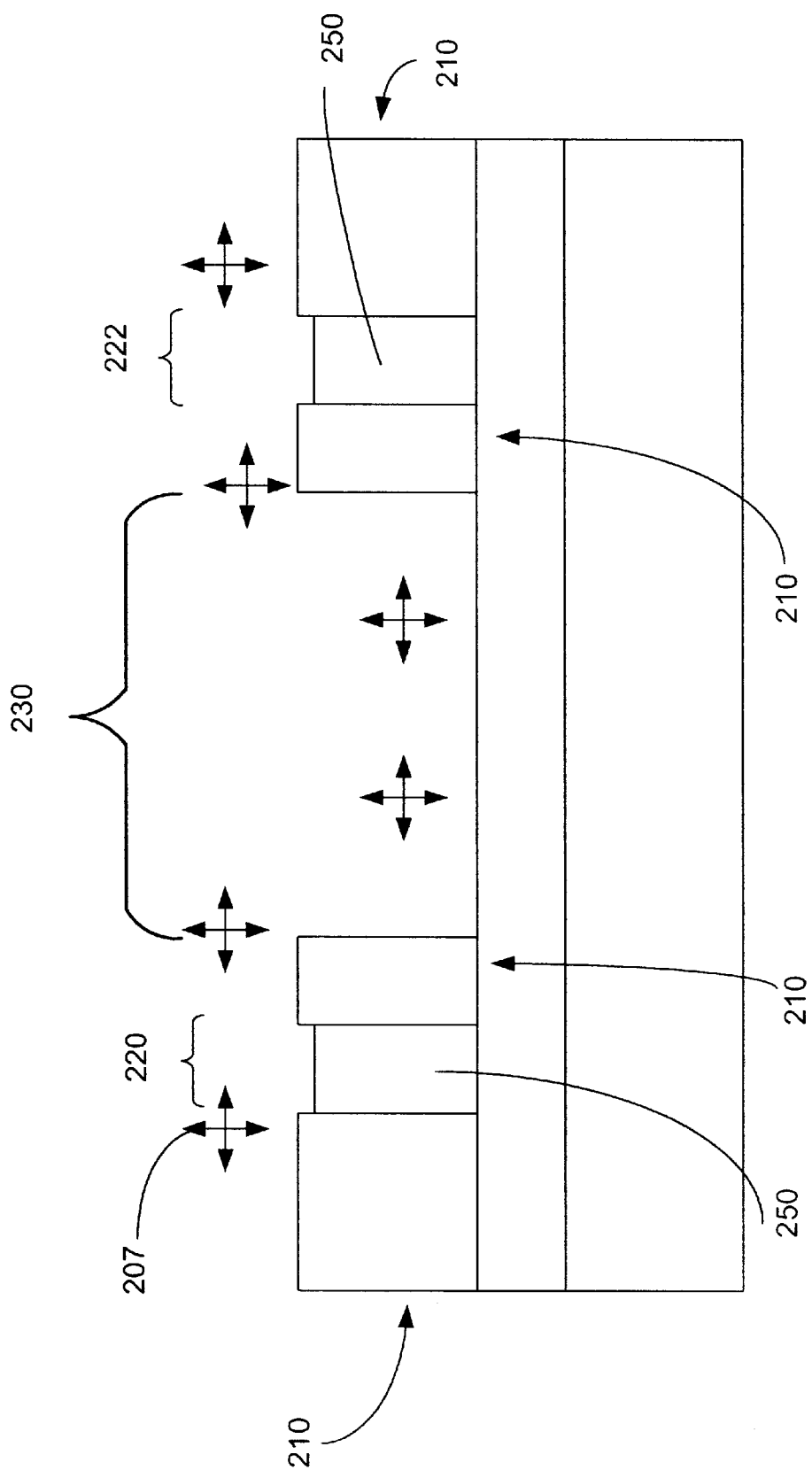
FIG. 8E is a cross sectional side view of an example step in the eighth selective deposition method of etching back the first metal deposited in FIG. 8D.

FIG. 8D illustrates the step of depositing material over the entire mold layer 210 surface. A copper (Cu) layer 250 is preferably conformally electroplated over the entire mold layer 210, although other conformal depositing techniques can be used, including but not limited to physical vapor deposition techniques. Alternatively, other materials for the windings structure can be used (and hence, other materials can be deposited in this step), including but not limited to gold, silver, or aluminum. Note that the high aspect-ratio wells 220 and 222, which will comprise the winding structures, are filled first. The copper layer 250 that coats any surface other than in the high aspect-ratio wells 220 and 222 is spread out over a wider surface than that in the narrower wells of the high aspect-ratio wells 220 and 222, resulting in a combined accumulation in the higher aspect ratio wells 220 and 222 that fills the higher aspect ratio wells 220 and 222 before filling the lower aspect ratio well 230. FIG. 8E illustrates that once the high aspect ratio wells 220 and 222 are filled, the deposited Cu layer 250 is etched back by isotropic wet-etch techniques, or alternatively, other isotropic or anisotropic techniques. Note the isotropic arrows 207 represent an isotropic etch. As a result of the differences in topology of the mold layer 210 (and consequently the differences in thickness of the copper layer 250 deposited on the mold layer 210), the copper layer 250 (and seed layer 240 (FIG. 8C)) is selectively removed from the low aspect ratio well 230 as well as any flat opened surface in the field of the mold layer 210 without the need for a lithography step. An additional benefit is that the copper winding structure of the final structure will thereby be electrically isolated by the mold layer 210.

FIG. 8F illustrates the step of removing the insulating layer 205 in the low aspect ratio well 230 in a self-aligned blanket dry etch (as represented by directional arrows 262) down to the metallic surface of the magnetic substrate 200. Alternatively, other etching techniques can be used, as previously described. Note that because the insulating layer 205 is much thinner than the mold layer 210, the blanket dry etch step does not significantly affect the height of the mold layer 210.

Figure 8G:
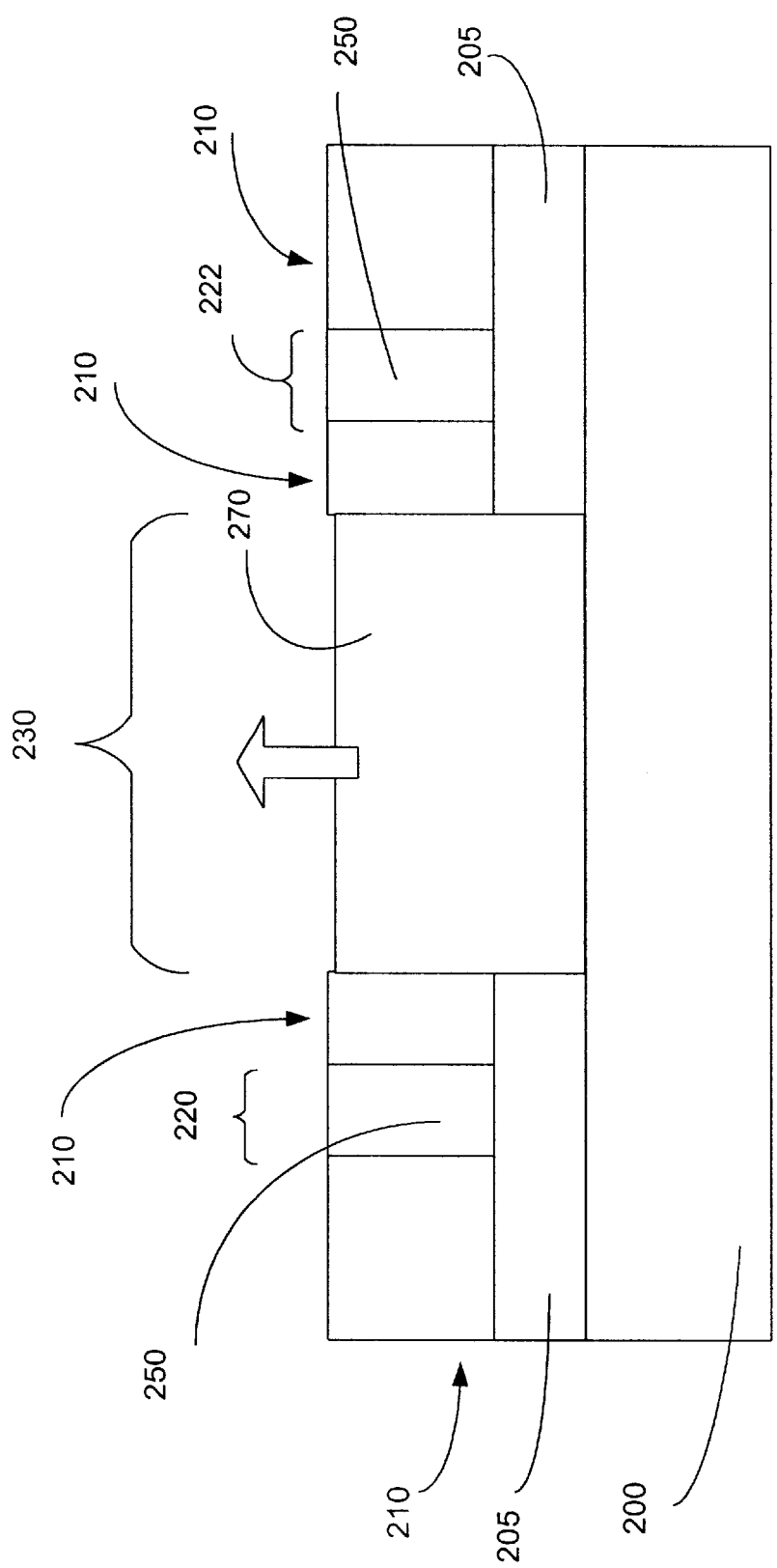
FIG. 8G is a cross sectional side view of an example step in the eighth selective deposition method of applying a second metal in the low aspect ratio well after the etch back depicted in FIG. 8F.

FIG. 8G illustrates the step of selectively electroplating magnetic material 270, preferably the material of the substrate such as NiFe in this non-limiting example, from the bottom of the magnetic (for example, NiFe ) substrate 200, filling the low aspect ratio well 230 that comprises the core structure. Alternatively, other depositing techniques can be used including, but not limited to, magnetic powder filled polymers deposited with screen printing techniques. The magnetic substrate 200 is used as an electrical contact. When the magnetic material (for example, NiFe) 270 electroplating is complete, the surface has become reasonably self-planarized. In addition, since the selective deposition method results in electrically, self-isolated structures, the mold layer 210 does not need to be removed and subsequent planarization issues (e.g. for micromachined device surfaces) are greatly ameliorated.

It should be emphasized that the above-described embodiments of the present invention, particularly, any "preferred" embodiments, are merely possible examples of implementations, merely set forth for a clear understanding of the principles of the invention. Many variations and modifications can be made to the above-described embodiment(s) of the invention without departing substantially from the spirit and principles of the invention. All such modifications and variations are intended to be included herein within the scope of this disclosure and the present invention and protected by the following claims.

Therefore, having thus described the invention, at least the following is claimed:

1. A method for creating one or more structures in a micromachined device, comprising the steps of:
   providing a substrate;
   forming upstanding nonconductive mold walls over the substrate so that first and second wells are formed, the second well being wider than the first well;
   applying a first material to the surface of the wells so that the first well fills with the first material before the second well; and
   removing the first material from the second well while leaving a portion of the first material in the first well.

2. The method of claim 1, further comprising the step of introducing a second material into the second well.

3. The method of claim 2, wherein the step of introducing a second material comprises at least one of conformal coating, electroplating, electroless plating, physical vapor deposition, CVD, and PECVD, plate through mold, spin casting, and screen printing.

4. The method of claim 2, wherein the second material comprises at least one of a conductive material, a semi-conductive material, and a non-conductive material.

5. The method of claim 2, wherein the second material comprises at least one of Cu, gold, silver, aluminum, NiFe, and CoNiFe.

6. The method of claim 2, wherein the second material comprises a polymer.

7. The method of claim 1, further comprising the step of applying an insulating layer on the substrate.

8. The method of claim 7, wherein the insulating layer comprises a polymer.

9. The method of claim 7, wherein the insulating layer comprises at least one of photoresists, dry-etched polyimide, negative tone epoxy, AZ 9260, and SU-8.

10. The method of claim 7, further comprising the steps of pre-baking, cross-linking, and post-baking the insulating layer.

11. The method of claim 1, wherein the step of removing the first material includes at least one of isotropically etching and anisotropically etching.

12. The method of claim 11, wherein the step of isotropically etching includes the step of wet etching.

13. The method of claim 1, wherein the step of applying comprises at least one of conformal coating, electroplating, electroless plating, screen printing, Physical Vapor Deposition (PVD), Chemical Vapor Deposition (CVD), and Plasma-Enhanced Chemical Vapor Deposition (PECVD).

14. The method of claim 1, further comprising the steps of:
applying a second material to the surface of the first material in the first well in an amount sufficient to spill into the second well;
removing the second material so that a portion of the second material is stacked on the first material in the first well while leaving a portion of the second material in the second well;
removing the mold walls to expose the sides of the first material in the first well and the second material in the first well and the second well; and
removing the first material.

15. The method of claim 1, wherein the mold walls comprise at least one of a conductive material, a semi-conductive material, and a non-conductive material.

16. The method of claim 1, wherein the mold walls comprise a polymer.

17. The method of claim 1, wherein the mold walls comprise at least one of the following photoresist, dry-etched polyimide, negative tone epoxy, AZ 9260, and SU-8.

18. The method of claim 1, wherein the step of forming comprises at least one of the following photolithography, x-ray lithography, and laser ablation.

19. The method of claim 1, wherein the substrate includes at least one of the following a conductive material, a semi-conductive material, and a non-conductive material.

20. The method of claim 1, wherein the substrate includes at least one of the following NiFe and CoNiFe.

21. The method of claim 1, further including the step of providing a seed layer to the mold surface.

22. The method of claim 21, wherein the seed layer comprises conductive metals.

23. The method of claim 22, wherein the conductive metals include Ti and Cu.

24. The method of claim 1, wherein the first material includes at least one of a conductive material, a semi-conductive material, and a non-conductive material.

25. The method of claim 1, wherein the first material comprises at least one of Cu, gold, silver, aluminum, NiFe, and CoNiFe.

26. The method of claim 1, wherein the first material includes a polymer.

27. The method of claim 1, further comprising the steps of:
applying the first material in the second well;
applying a non-conductive material on the surface of the first material;
removing enough of the non-conductive material to expose the first material surface while leaving the non-conductive material on the first material located in the second well;
applying an additional layer of the first material on the exposed first material surface;
removing the non-conductive material to uncover the first material surface in the second well; and
removing the first material from the second well while retaining material on all other mold surfaces.

28. The method of claim 1, further comprising the step of retaining the mold in a final structure.

29. The method of claim 1, wherein the step of removing includes at least one of acetone etching and blanket reactive ion etching.

30. The method of claim 1, wherein the forming step includes the step of isolating the first well from the second well.

31. A method for selective deposition of materials in micro-machined molds, comprising the steps of:
creating a mold with wells of varying height-to-width ratios on a substrate;
applying a first fill layer material on the mold surfaces, such that the wells with the higher height-to-width ratios are filled before the wells with lower height-to-width ratios; and
removing the first fill layer material until the wells with the lower height-to-width ratios have the first fill layer material removed, whereby a portion of the first fill layer material remains in the wells with the higher height-to-width ratios.

32. The method of claim 31, further comprising the step of introducing a second fill layer material into the lower height-to-width ratio well.

33. The method of claim 32, wherein the step of introducing comprises at least one of conformal coating, electroplating, electroless plating, Physical Vapor Deposition (PVD), Chemical Vapor Deposition (CVD), Plasma-Enhanced Chemical Vapor Deposition (PECVD), plate through mold, spin casting, and screen printing.

34. The method of claim 32, wherein the second fill layer includes at least one of a non-conductive material, a semi-conductive material, and a conductive material.

35. The method of claim 32, wherein the second fill layer includes one of NiFe and CoNiFe.

36. The method of claim 31, wherein the step of removing includes at least one of isotropically etching and anisotropically etching.

37. The method of claim 36, wherein the step of isotropically etching includes the step of wet etching.

38. The method of claim 31, wherein the step of applying comprises at least one of conformal coating, electroplating, electroless plating, screen printing, Physical Vapor Deposition (PVD), Chemical Vapor Deposition (CVD), and Plasma-Enhanced Chemical Vapor Deposition (PECVD).

39. The method of claim 31, wherein the step of applying further comprises sequentially filling varying height-to-width ratio wells with different fill layer materials.

40. The method of claim 31, wherein the step of applying further comprises stacking the higher height-to-width ratio well with different fill layer materials.

41. The method of claim 31, wherein the mold material comprises at least one of a conductive material, a semi-conductive material, and a non-conductive material.

42. The method of claim 31, wherein the mold material includes a polymer.

43. The method of claim 31, wherein the mold material comprises at least one of photoresists, dry-etched polyimide, negative tone epoxy, AZ 9260, and SU-8.

44. The method of claim 31, wherein the step of forming comprises at least one of photolithographing, x-ray lithographing, and laser ablation.

45. The method of claim 31, wherein the substrate includes at least one of a conductive material, a semi-conductive material, and a non-conductive material.

46. The method of claim 31, further comprising the step of depositing a seed layer on the mold surfaces.

47. The method of claim 45, wherein the seed layer includes a conductive material.

48. The method of claim 45, wherein the seed layer includes Ti and Cu.

49. The method of claim 31, wherein the first fill layer material includes at least one of a conductive material, a semi-conductive material, and a non-conductive material.

50. The method of claim 31, wherein the first fill layer includes Cu.

51. The method of claim 31, further comprising the steps of:
    applying the first layer material in the lower height-to-width ratio well;
    applying a non-conductive layer material on the surface of the first fill layer material;
    removing enough of the non-conductive layer material to expose the first layer material surface while leaving the non-conductive layer material on the first layer material located in the lower height-to-width ratio well;
    applying an additional layer of the first layer material on the exposed first layer material surface;
    removing the non-conductive layer material to uncover the first layer material surface in the lower height-to-width ratio well; and
    removing the first layer material from the lower height-to-width ratio well while retaining the first layer material on all other mold surfaces.

52. The method of claim 31, further comprising the step of applying an insulating layer on the substrate.

53. The method of claim 52, further comprising the steps of pre-baking, cross-linking, and post-baking the insulating layer.

54. The method of claim 52, wherein the insulating layer includes a polymer.

55. The method of claim 52, wherein the insulating layer comprises at least one of photoresists, dry-etched polyimide, negative tone epoxy, AZ 9260, and SU-8.

56. The method of claim 31, further comprising the step of retaining the mold in a final structure.

57. The method of claim 31, further comprising the steps of:
    applying at least a second fill layer material to the surface of the first fill layer material in the higher height-to-width ratio well in an amount sufficient to spill into the lower height-to-width ratio well;
    removing the second fill layer material so that a portion of the second fill layer material is stacked on the first fill layer material in the higher height-to-width ratio well while leaving a portion of the second fill layer material in the lower height-to-width ratio well;
    removing the mold to expose the sides of the first fill layer material in the higher height-to-width ratio well and the second fill layer material in the higher height-to-width ratio and in the lower height-to-width ratio well; and
    removing the first fill layer material.

58. The method of claim 31, wherein the step of removing includes at least one of acetone etching and blanket reactive ion etching.

59. The method of claim 31, wherein the creating step includes the step of isolating the higher height-to-width ratio well from the lower height-to-width ratio well.

* * * * *